(12) United States Patent
Yang et al.

(10) Patent No.: US 11,798,638 B2
(45) Date of Patent: Oct. 24, 2023

(54) MITIGATING NEIGHBOR INTERFERENCE TO SELECT GATES IN 3D MEMORY

(71) Applicant: SanDisk Technologies LLC, Addison, TX (US)

(72) Inventors: Xiang Yang, Santa Clara, CA (US); Kou Tei, San Jose, CA (US); Ohwon Kwon, Pleasanton, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/484,218

(22) Filed: Sep. 24, 2021

(65) Prior Publication Data

US 2023/0101019 A1    Mar. 30, 2023

(51) Int. Cl.
| | |
|---|---|
| *G11C 16/34* | (2006.01) |
| *G11C 16/04* | (2006.01) |
| *G11C 16/24* | (2006.01) |
| *G11C 16/08* | (2006.01) |
| *G11C 16/10* | (2006.01) |
| *G11C 11/56* | (2006.01) |
| *H01L 25/065* | (2023.01) |
| *H10B 43/10* | (2023.01) |
| *H10B 43/27* | (2023.01) |

(52) U.S. Cl.
CPC ...... *G11C 16/3427* (2013.01); *G11C 11/5628* (2013.01); *G11C 11/5671* (2013.01); *G11C 16/0483* (2013.01); *G11C 16/08* (2013.01); *G11C 16/10* (2013.01); *G11C 16/24* (2013.01); *G11C 16/3459* (2013.01); *H01L 25/0657* (2013.01); *H01L 2225/06562* (2013.01); *H10B 43/10* (2023.02); *H10B 43/27* (2023.02)

(58) Field of Classification Search
CPC ............ G11C 16/3427; G11C 11/5628; G11C 11/5671; G11C 16/0483; G11C 16/08; G11C 16/10; G11C 16/24; G11C 16/06; G11C 16/12; G11C 16/30; G11C 16/32; G11C 16/3418
See application file for complete search history.

(56) References Cited

U.S. PATENT DOCUMENTS

| | | | |
|---|---|---|---|
| 7,206,235 B1 | 4/2007 | Lutze et al. | |
| 8,081,514 B2 * | 12/2011 | Mui | G11C 16/10 365/185.23 |

(Continued)

*Primary Examiner* — Kretelia Graham
(74) *Attorney, Agent, or Firm* — Vierra Magen Marcus LLP

(57) ABSTRACT

Technology for mitigating interference to select transistors in 3D memory is disclosed. In one aspect, a control circuit pre-charges a first set of bit lines to a first voltage and pre-charges a second set of bit lines to a second voltage greater than the first voltage. The control circuit may increase the voltage on the first set of bit lines to the second voltage while the second set of bit lines are floating to couple up the voltages on the second set of bit lines to a voltage greater than the second voltage. The higher voltage on the second set of bit lines compensates for interference that some of the select transistors may experience from an adjacent select line. For example, the higher voltage can prevent a leakage current in the select transistors from occurring. Preventing the leakage current can improve boosting of NAND channel voltages, thereby preventing program disturb.

17 Claims, 26 Drawing Sheets

(56) References Cited

U.S. PATENT DOCUMENTS

| | | | |
|---|---|---|---|
| 8,089,815 B2 * | 1/2012 | Li | G11C 11/5628 365/185.26 |
| 8,995,211 B2 | 3/2015 | Lee | |
| 9,087,601 B2 | 7/2015 | Dutta et al. | |
| 10,553,298 B1 * | 2/2020 | Zhao | H01L 27/11582 |
| 10,559,368 B1 * | 2/2020 | Yang | G11C 16/24 |
| 2011/0110153 A1 | 5/2011 | Dutta et al. | |
| 2011/0216600 A1 | 9/2011 | Goda et al. | |

* cited by examiner

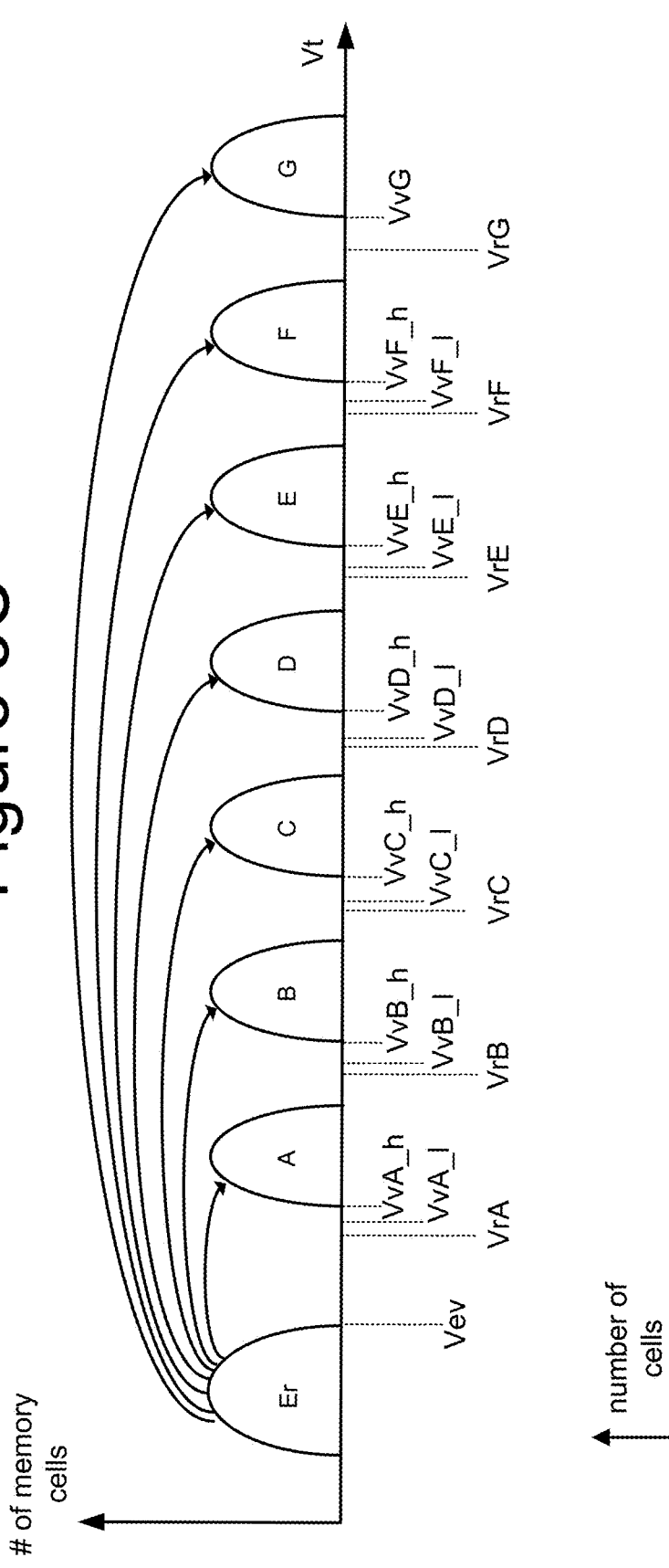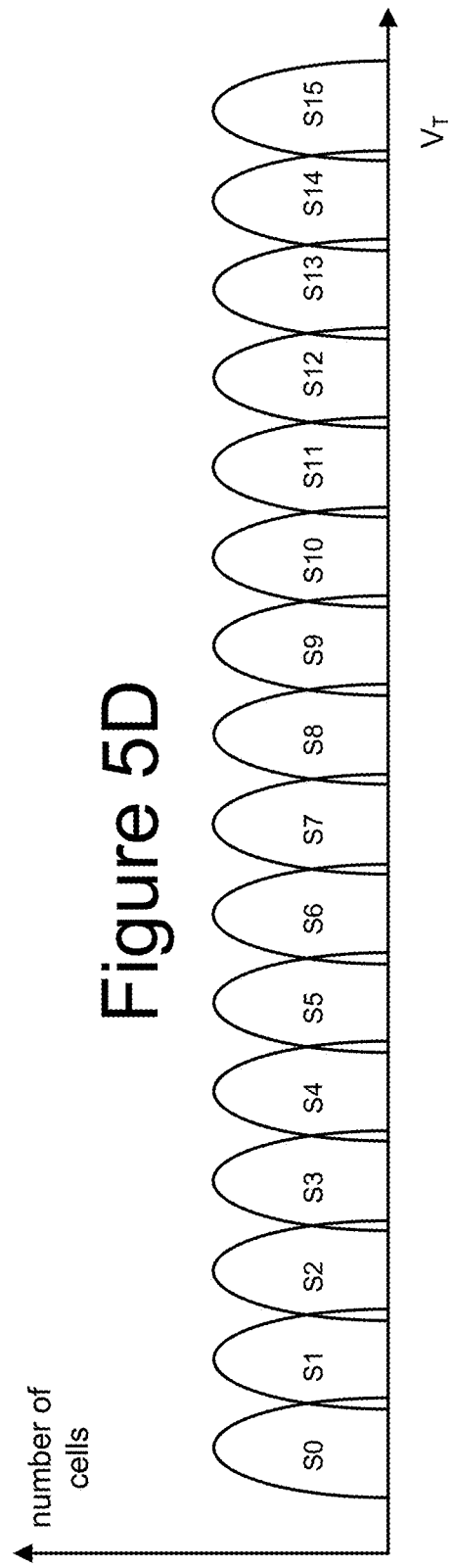

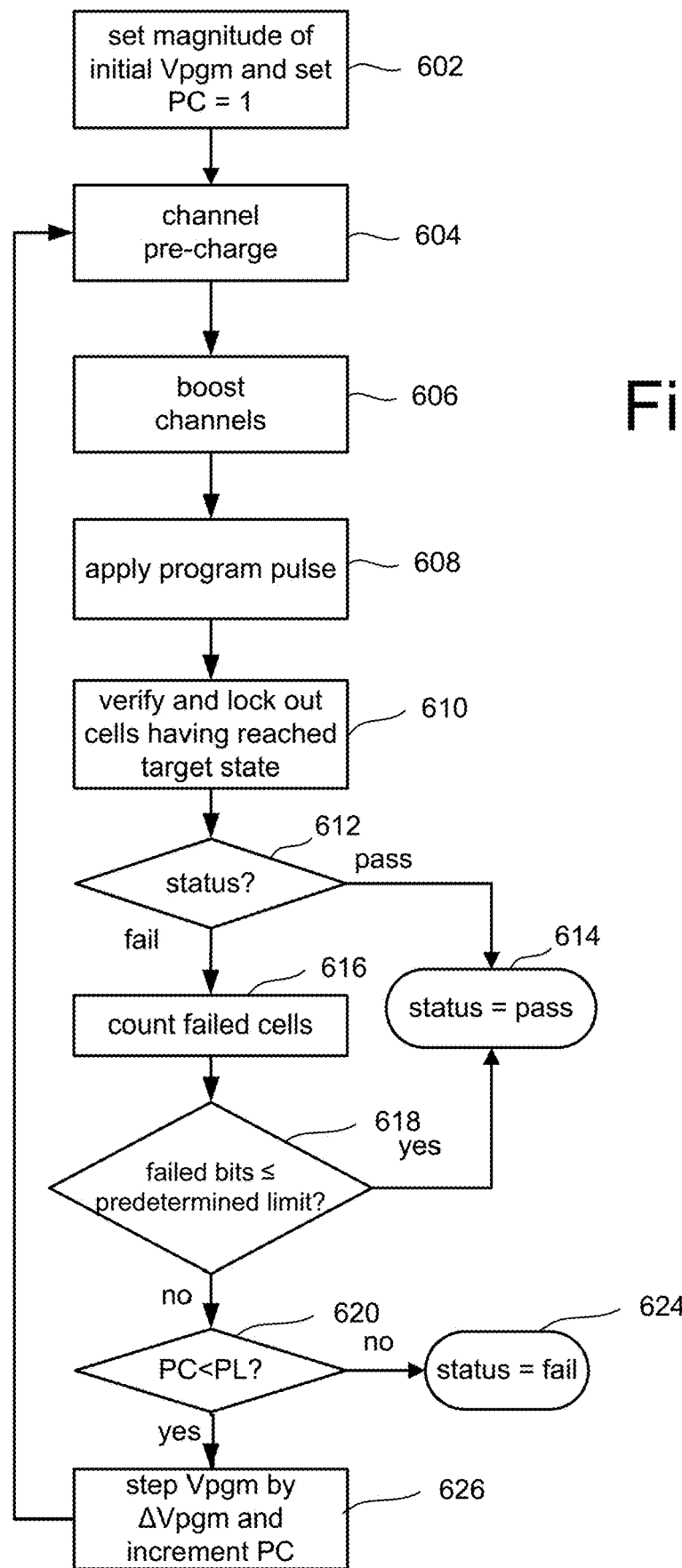

Sub-block, 430
Sub-block, 440

MITIGATING NEIGHBOR INTERFERENCE TO SELECT GATES IN 3D MEMORY

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that it can be read back successfully.

BRIEF DESCRIPTION OF THE DRAWINGS

Like-numbered elements refer to common components in the different figures.

FIG. 5C depicts threshold voltage distributions.

FIG. 5D depicts threshold voltage distributions.

FIG. 6 is a flow chart describing one embodiment of a process for programming non-volatile memory.

DETAILED DESCRIPTION

Figure 1:
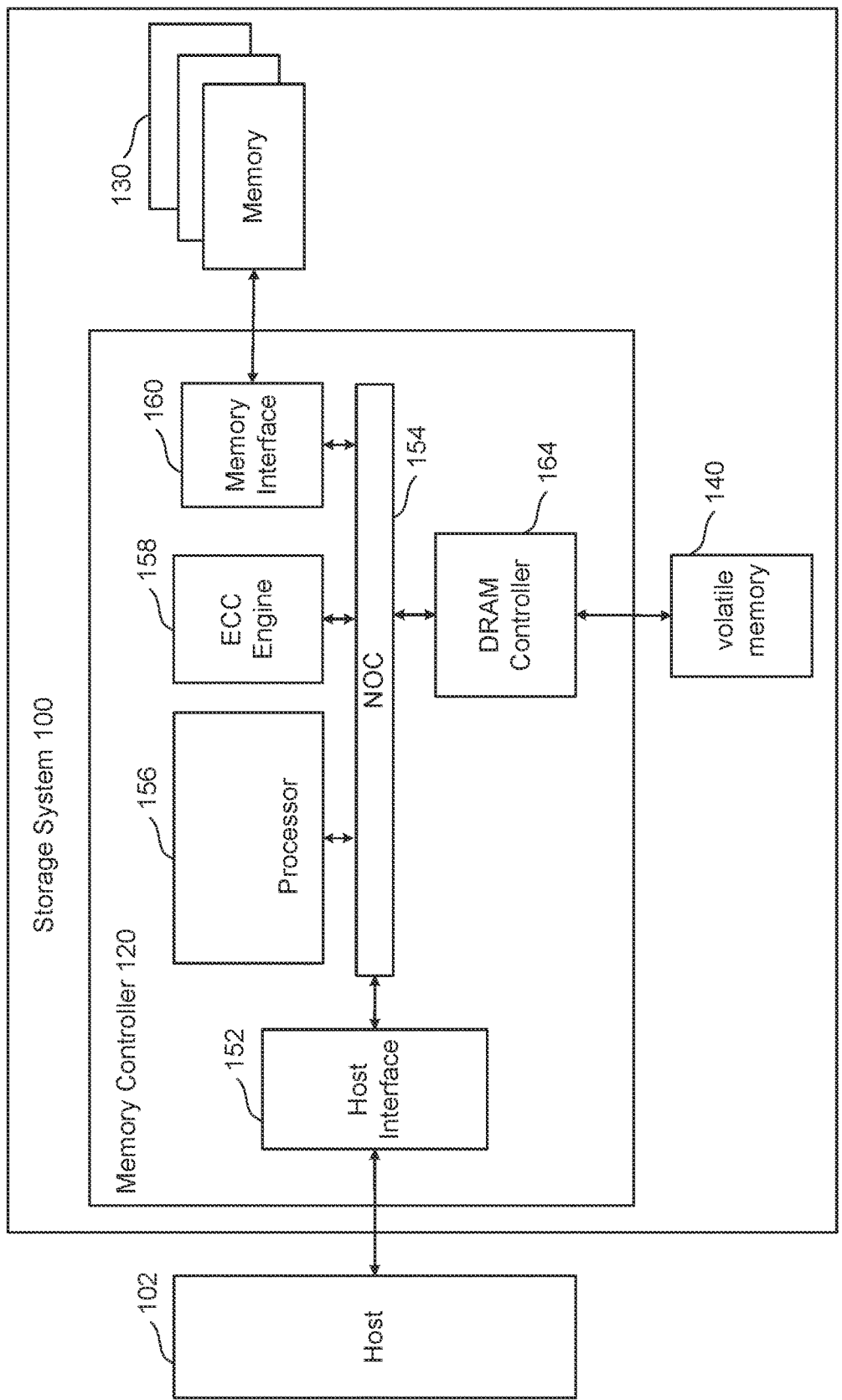
FIG. 1 is a block diagram depicting one embodiment of a storage system.

Some memory system implement a three dimensional non-volatile memory structure. In order to isolate portions of the memory structure to enable separate addressing of subsets of the memory (or for other reasons), the memory structure will be etched and the removed portions of the memory structure due to the etch are filled in with a dielectric material. However, this etching can impact select transistors. For example, the etching may etch away a portion of the material from which some of the select transistors are formed. Therefore, etching may, for example, make some select transistors suspectable to interference from neighboring select lines. Herein, this interference may be referred to as neighbor select gate interference (NSI). This NSI may result in leakage current in the select transistors, which can impair memory operation. As one example, the boosting of NAND channel potential during programming can be impaired, which could lead to program disturb. Other memory operations including sensing operations may also be impacted by NSI to select transistors.

In some embodiments, the memory structure has NAND strings together in what is referred to herein as a block. The block is sub-divided into sub-blocks that each contain a large number of NAND strings. Each sub-block may be selected by a different select line. Each select line connects to the control gates of select transistors in the NAND strings. The select lines are separated by a dielectric material. To select one of the sub-blocks, a select voltage may be applied to the select line of that sub-block while applying an unselect voltage to the select lines of other sub-blocks. It is possible that some of the select transistors in one sub-block may suffer interference (NSI) from the select line of an adjacent sub-block. Techniques are described herein for compensating for such interference.

One embodiment of a control circuit boosts bit line voltages to mitigate NSI to select transistors. The technique could be used during programming, but is not limited thereto. The control circuit pre-charges a first set of bit lines to a first voltage and pre-charges a second set of bit lines to a second voltage that is greater than the first voltage. In an embodiment, the first voltage is a program enable voltage and the second voltage is a program inhibit voltage. The control circuit floats the second set of bit lines after they have been pre-charged to the second voltage. The control circuit increases the voltage on the first set of bit lines from the first voltage to the second voltage while the second set of bit lines are floating to couple up the voltages on the second set of the bit lines to a voltage greater than the second voltage. For example, the first set of bit lines are raised to a program inhibit voltage and the second (floating) set of bit lines are coupled up to a voltage that is greater than the program inhibit voltage. In an embodiment, the second set of bit lines are coupled up to about twice the program inhibit voltage. The higher voltage on the second set of bit lines compensates for NSI that some of the select transistors may experience. For example, the higher voltage can prevent a leakage current in the select transistors from occurring. Preventing the leakage current can improve boosting of NAND channel voltages, thereby preventing program disturb. However, coupling up the bit line voltage may have other benefits, and is not limited to program operations.

One embodiment of a control circuit applies a higher magnitude select voltage to a drain side select line for any loops of a program operation in which at least some memory cells receive slow programming. The slow programming is referred to herein as quick pass write (QPW). The control circuit applies a lower magnitude select voltage to the drain side select line for any loops of the program operation in which no memory cell receives slow programming. The use of two different magnitudes of the select voltage mitigates NSI to the select transistors.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a volatile memory 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
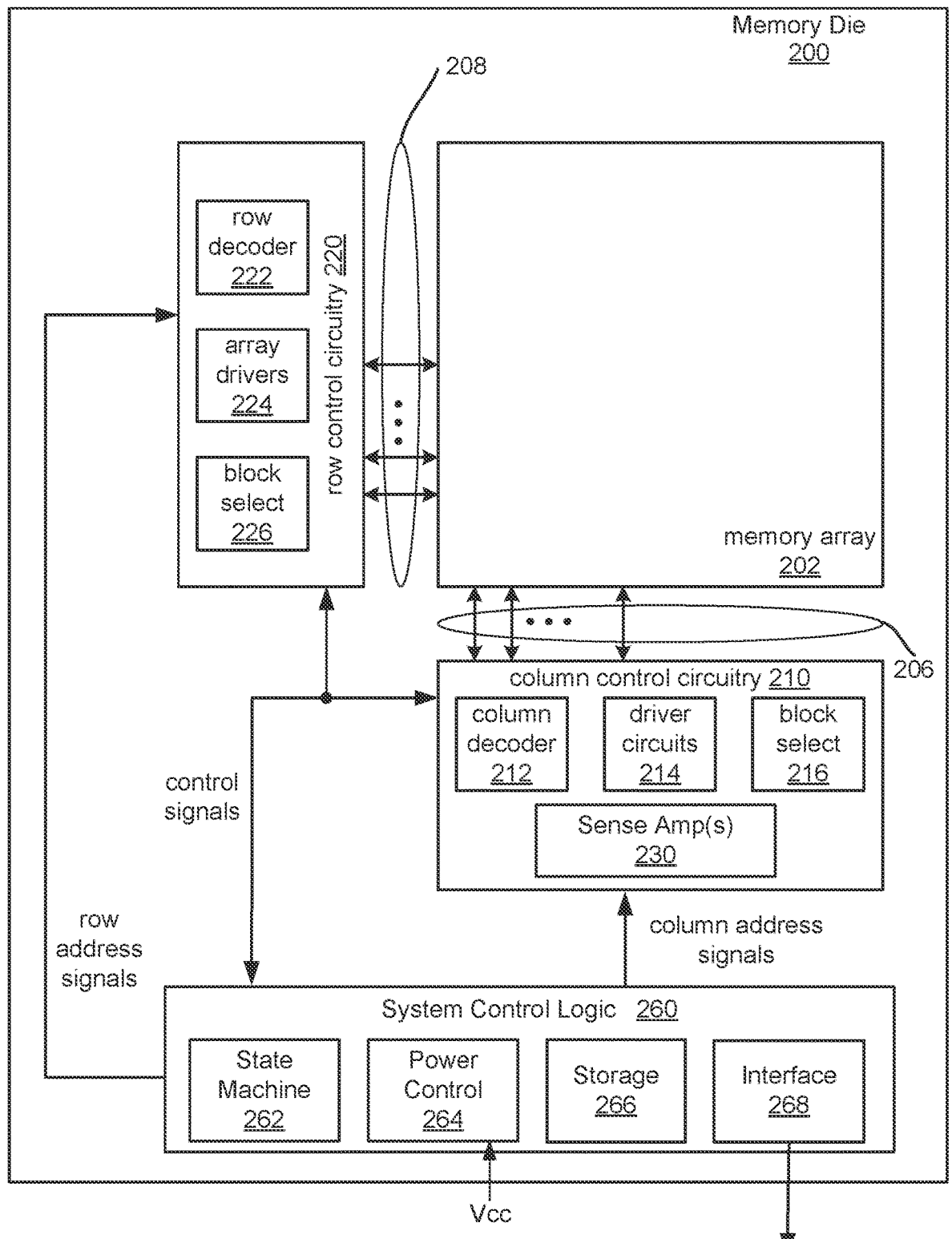
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 260, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations and may include charge pumps and regulator circuit for creating regulating voltages. The memory die 200 receives power from an external source such as memory controller 120 or host 102. The power may be provided via an electrical interface having signals such as Vss (e.g., ground) and Vcc (e.g., about 3 V). The power control module 264 may generate various voltages by use of the supplied power. In an embodiment, the power control 264 uses Vcc to generate bit line voltages that have a magnitude that is less than or equal to Vcc. These voltage may be used to charge up the bit lines. In an embodiment, the voltage on some of the bit lines are floated and coupled up by increasing a voltage on other bit lines. In this manner, the floating bit lines may be coupled up to a voltage that is greater than Vcc. System control logic 260 includes storage 266 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
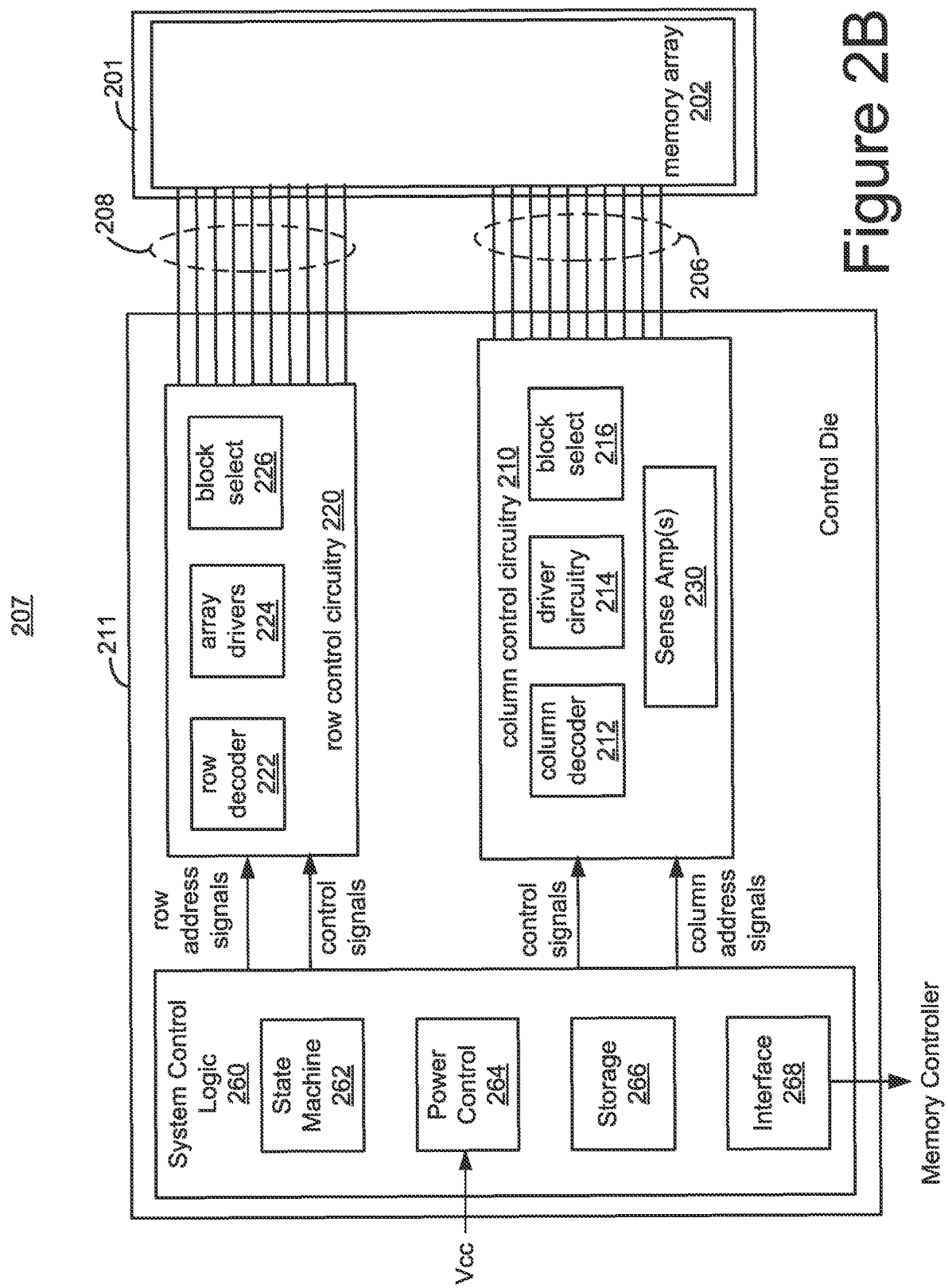
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labeled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, sense amps 230, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 2C:
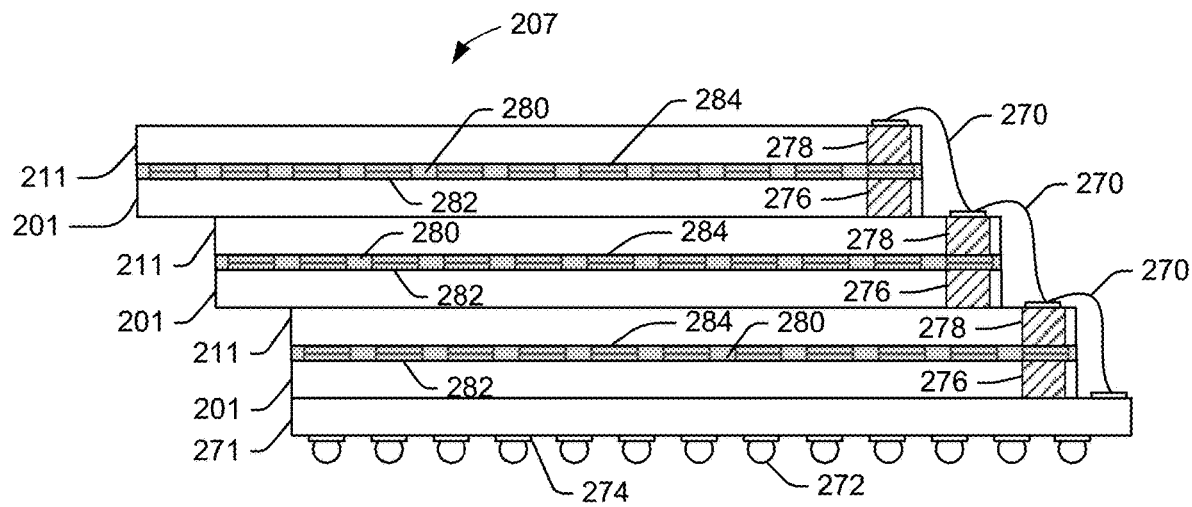
FIGS. 2C and 2D depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control die 211 and multiple memory structure die 201. FIG. 2C depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 2C).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 2D:
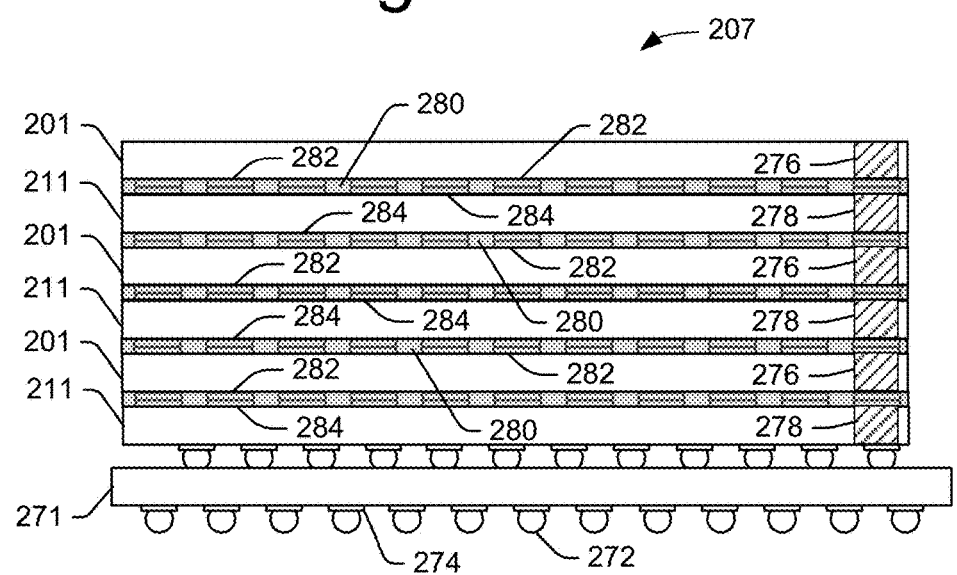

FIG. 2D depicts a side view of another embodiment of an integrated memory assembly 207 stacked on a substrate 271. The integrated memory assembly 207 of FIG. 2D has three control die 211 and three memory structure die 201. In some embodiments, there are many more than three memory dies 201 and many more than three control dies 211. In this example, each control die 211 is bonded to at least one memory structure die 201. Optionally, a control die 211 may be bonded to two or more memory structure die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 2C, the integrated memory assembly 207 in FIG. 2D does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 3:
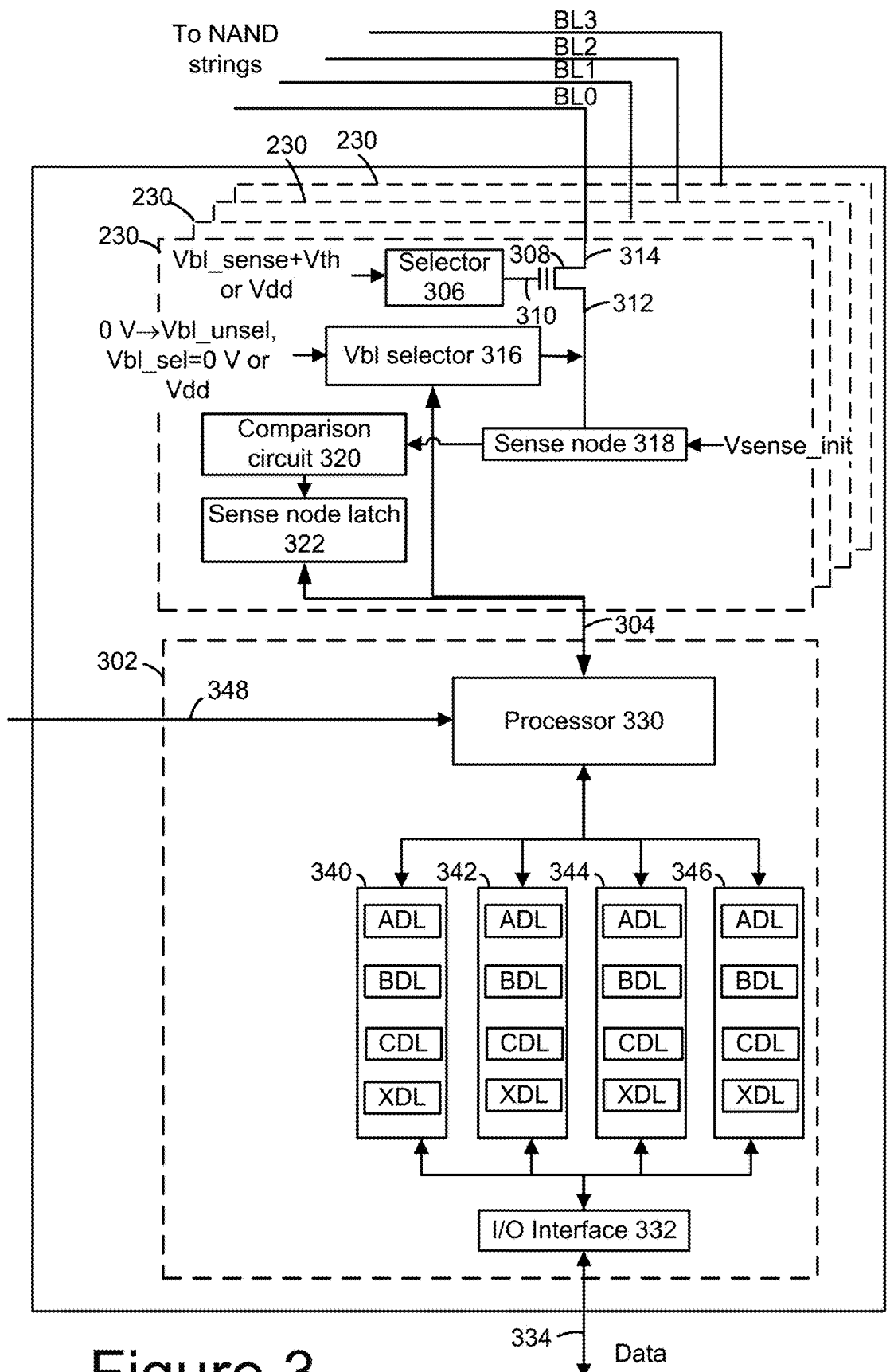
FIG. 3 depicts circuitry used to sense data from non-volatile memory.

FIG. 3 is a block diagram depicting one embodiment of a portion of column control circuitry 210 that is partitioned into a plurality of sense amplifiers 230, and a common portion, referred to as a managing circuit 302. In one embodiment, each sense amplifier 230 is connected to a respective bit line which in turn is connected to one or more NAND strings. In one example implementation, each bit line is connected to six NAND strings, with one NAND string per sub-block. Managing circuit 302 is connected to a set of multiple (e.g., four, eight, etc.) sense amplifiers 230. Each of the sense amplifiers 230 in a group communicates with the associated managing circuit via data bus 304.

Each sense amplifier 230 operates to provide voltages to bit lines (see BL0, BL1. BL2. BL3) during program, verify, erase and read operations. Sense amplifiers are also used to sense the condition (e.g., data state) to a memory cells in a NAND string connected to the bit line that connects to the respective sense amplifier.

Each sense amplifier 230 includes a selector 306 or switch connected to a transistor 308 (e.g., an nMOS). Based on voltages at the control gate 310 and drain 312 of the transistor 308, the transistor can operate as a pass gate or as a bit line clamp. When the voltage at the control gate is sufficiently higher than the voltage on the drain, the transistor operates as a pass gate to pass the voltage at the drain to the bit line (BL) at the source 314 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 306 may pass a power supply voltage Vdd, (e.g., 3-4 V) to the control gate of the transistor 308 to cause it to operate as a pass gate.

When the voltage at the control gate is lower than the voltage on the drain, the transistor 308 operates as a source-follower to set or clamp the bit line voltage at Vcg–Vth, where Vcg is the voltage on the control gate 310 and Vth, e.g., 0.7 V, is the threshold voltage of the transistor 308. This assumes the source line is at 0 V. If Vcelsrc is non-zero, the bit line voltage is clamped at Vcg–Vcelsrc–Vth. The transistor is therefore sometimes referred to as a bit line clamp (BLC) transistor, and the voltage Vcg on the control gate 310 is referred to as a bit line clamp voltage, Vblc. This mode can be used during sensing operations such as read and verify operations. The bit line voltage is thus set by the transistor 308 based on the voltage output by the selector 306. For example, the selector 306 may pass Vsense+Vth, e.g., 1.5 V, to the control gate of the transistor 308 to provide Vsense, e.g., 0.8 V, on the bit line. A Vbl selector 316 may pass a relatively high voltage such as Vdd to the drain 312, which is higher than the control gate voltage on the transistor 308, to provide the source-follower mode during sensing operations. Vbl refers to the bit line voltage.

The Vbl selector 316 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 316 can pass a program-enable voltage signal such as 0 V for respective bit lines of selected NAND strings during a program loop. The Vbl selector 316 can pass a slow programming voltage (QPW) to achieve a slower programming for a memory cell, which means that the Vt of the memory cell will not increase as much relative to applying the full program enable voltage (e.g., 0V) to the bit line.

In one approach, the selector 306 of each sense circuit can be controlled separately from the selectors of other sense circuits. The Vbl selector 316 of each sense circuit can also be controlled separately from the Vbl selectors of other sense circuits.

During sensing, a sense node 318 is charged up to an initial voltage, Vsense_init, such as 3 V. The sense node is then passed to the bit line via the transistor 308, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state.

In particular, the comparison circuit 320 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. For example, in a program-verify test, a 0 can denote fail and a 1 can denote pass. The bit in the sense node latch can be read out in a state bit scan operation of a scan operation or flipped from 0 to 1 in a fill operation. The bit in the sense node latch 322 can also be used in a lockout scan to decide whether to set a bit line voltage to an inhibit or a program enable level in a next program loop. L Managing circuit 302 comprises a processor 330, four example sets of data latches 340, 342, 344 and 346, and an I/O interface 332 coupled between the sets of data latches and the data bus 334. FIG. 3 shows four example sets of data latches 340, 342, 344 and 346; however, in other embodiments more or less than four can be implemented. In one embodiment, there is one set of latches for each sense amplifier 230. One set of three data latches, e.g., comprising individual latches ADL, BDL, CDL and XDL, can be provided for each sense circuit. In some cases, a different number of data latches may be used. In a three bit per memory cell embodiment, ADL stores a bit for a lower page of data, BDL stores a bit for a middle page of data, CDL stores a bit for an upper page of data and XDL serves as an interface latch for storing/latching data from the memory controller.

Processor 330 performs computations, such as to determine the data stored in the sensed memory cell and store the determined data in the set of data latches. Each set of data latches 340-346 is used to store data bits determined by processor 330 during a read operation, and to store data bits imported from the data bus 334 during a program operation which represent write data meant to be programmed into the memory. I/O interface 332 provides an interface between data latches 340-346 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to processor 330 via the data bus 304. At that point, processor 330 determines the resultant memory state by consideration of the tripping event(s) of the sense circuit and the information about the applied control gate voltage from the state machine via input lines 348. It then computes a binary encoding for the memory state and stores the resultant data bits into data latches 340-346.

Some implementations can include multiple processors 330. In one embodiment, each processor 330 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 330 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 340-346 from the data bus 334. During reprogramming, a respective set of data latches of a memory cell can store data indicating when to enable the memory cell for reprogramming based on the program pulse magnitude.

The program operation, under the control of the state machine 262, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 330 monitors the read back memory state relative to the desired memory state. When the two are in agreement, processor 330 sets the bit line in a program inhibit mode such as by updating its latches. This inhibits the memory cell coupled to the bit line from further programming even if additional program pulses are applied to its control gate.

Figure 4:
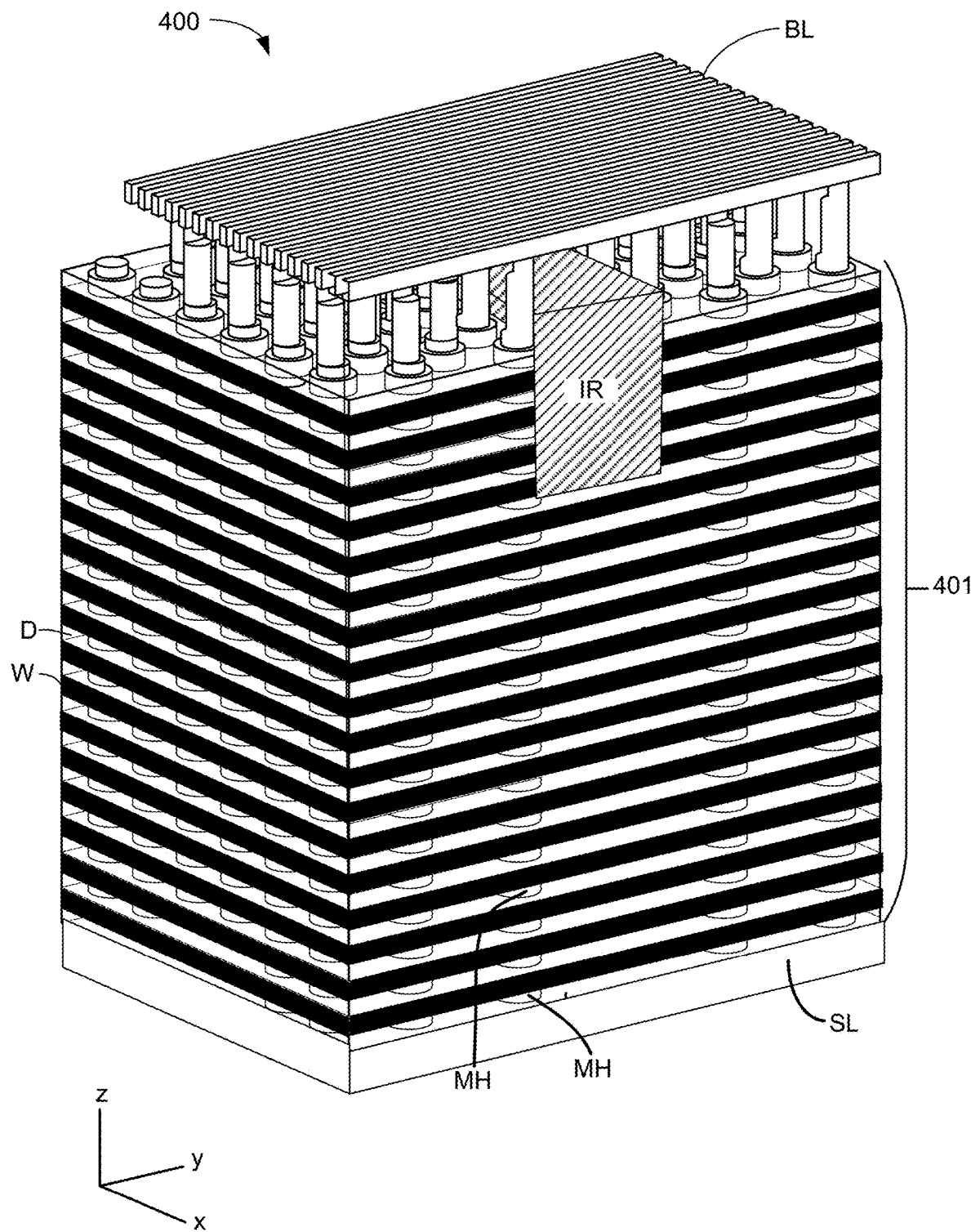
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
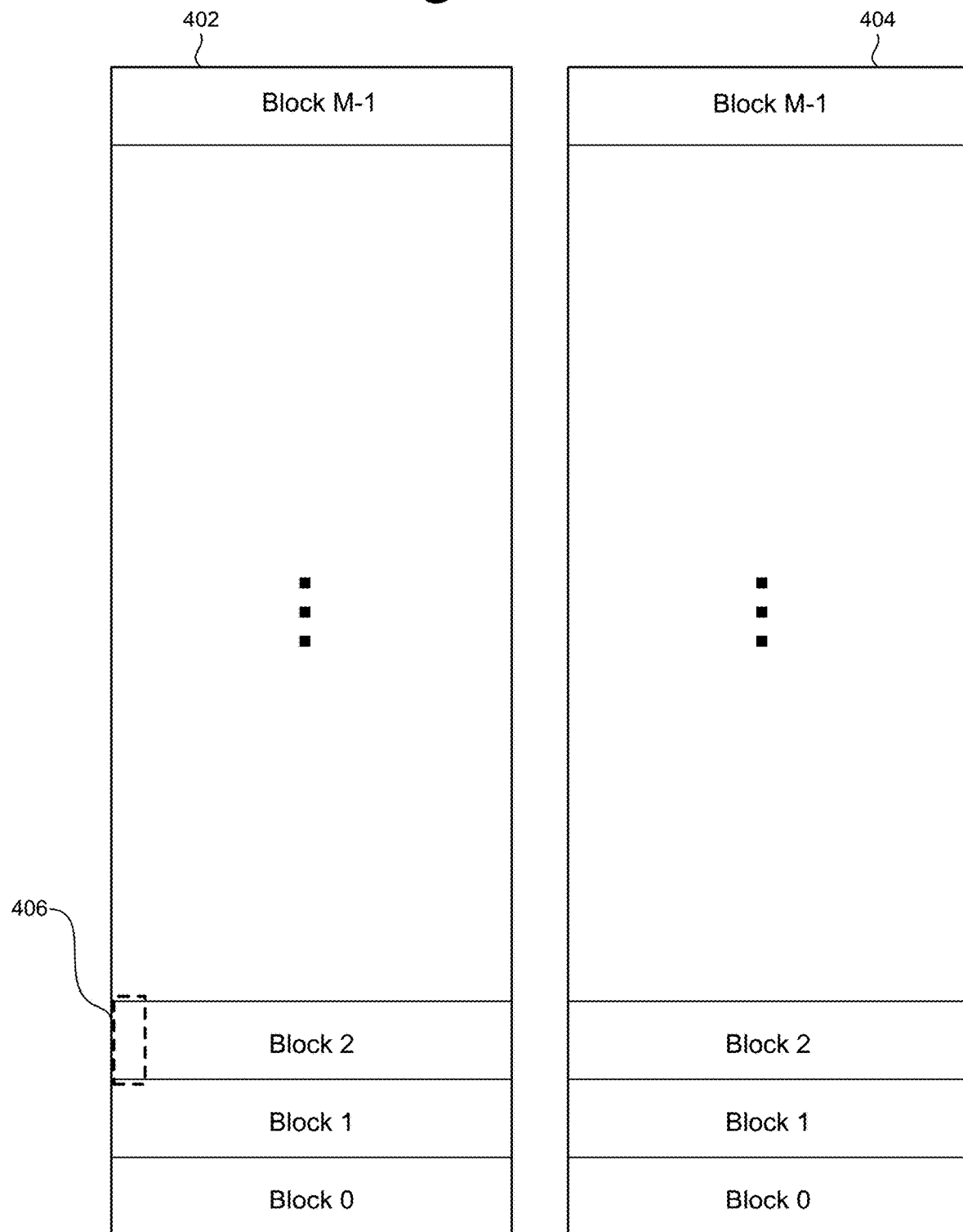
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 402/404, more or less than two planes can be implemented. In some embodiments, memory structure 202 includes eight planes.

Figure 4B:
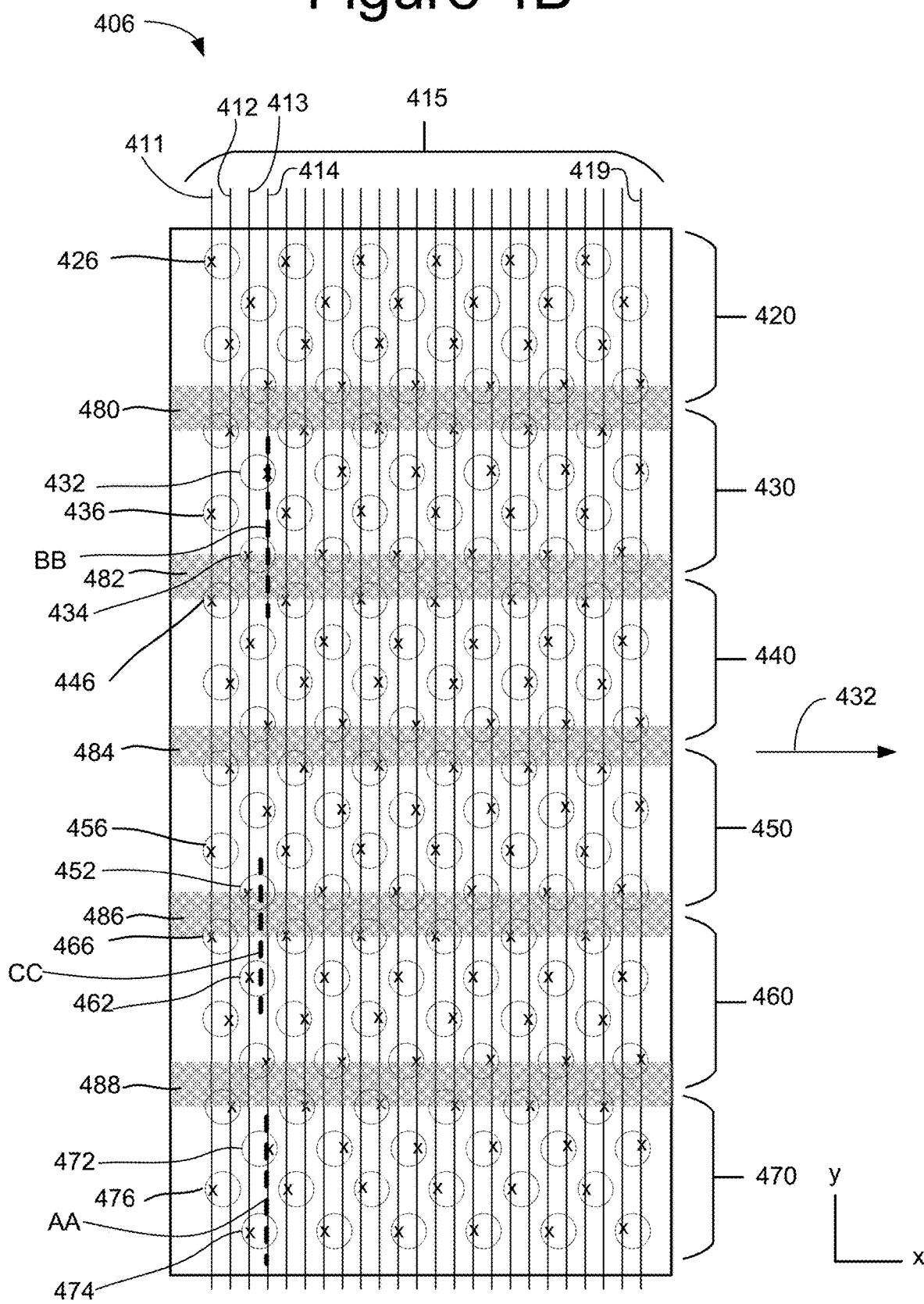
FIG. 4B depicts a top view of a portion of one embodiment of a block of memory cells.

FIGS. 4B-4J depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 426, 432, 436, 446. 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of $SiO_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470 all of which are referred to as sub-blocks. In one embodiment, the isolation regions only divide the layers used to implement select gates so that NAND strings in different sub-blocks can be independently selected. In one example implementation, a bit line only connects to one vertical column/NAND string in each of regions (sub-blocks) 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

FIG. 4B shows that the isolation regions 480, 482, 484, 486, 488 each cut into a portion of some of the memory holes. For example, isolation region 482 cuts into a portion of memory hole 446. Recall that the isolation region only goes down as far as the SGD layer. Select transistors are formed in the SGD layer. Thus, the isolation region cuts into a portion of the select transistors. In FIG. 4B, such memory holes have a semi-circular shape. However, the isolation region could cut into either more or less than half of the memory hole. Herein, the term "semi-circle select transistor" may be used to refer to a select transistor formed in a memory hole that is cut into by an isolation region. Alternatively, the term "partial-circle select transistor" may be used herein to refer to a select transistor formed in a memory hole that is cut into by an isolation region. Herein, the term "full-circle select transistor" will be used to refer to a select transistor formed in memory holes that are not cut into by an isolation region.

Figure 4C:
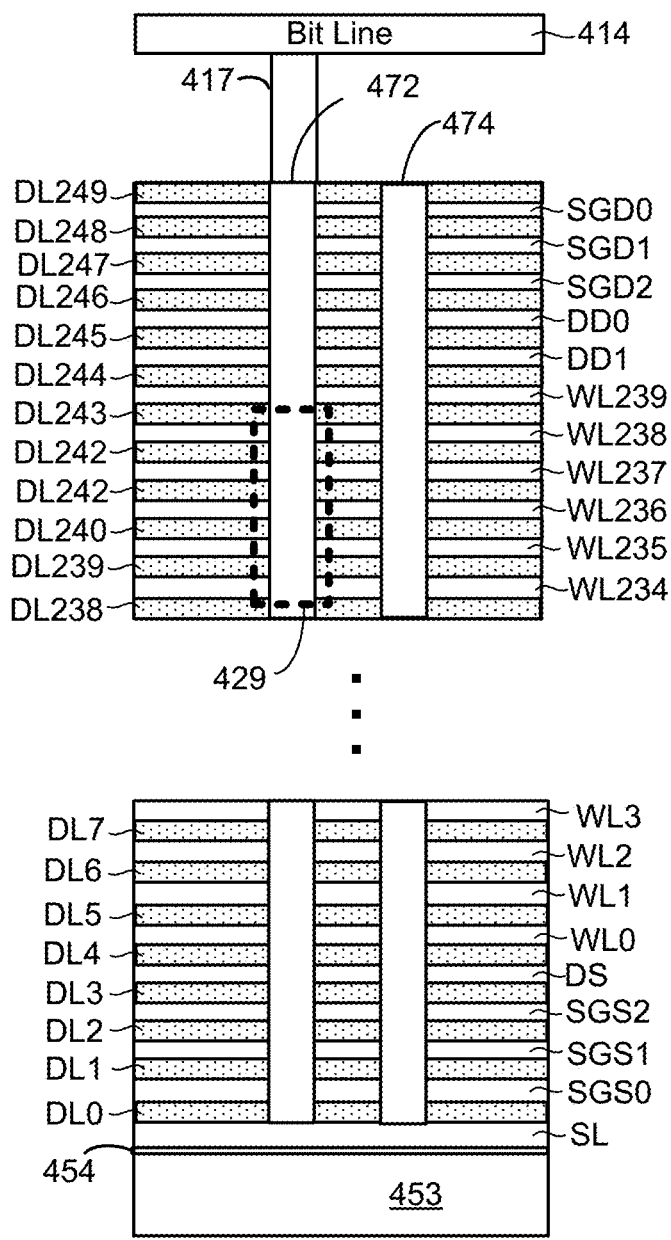
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). The structure of FIG. 4C includes three drain side select layers SGD0, SGD1 and SGD2; three source side select layers SGS0, SGS1, and SGS2; three dummy word line layers DD0, DD1, and DDS; two hundred and forty word line layers WL0-WL239 for connecting to data memory cells, and two hundred and fifty dielectric layers D10-DL249. Other embodiments can implement more or less than the numbers described above for FIG. 4C. In one embodiment, SGD0, SGD1 and SGD2 are connected together; and SGDS0, SGS1 and SGS2 are connected together.

Vertical columns 472 and 474 are depicted protruding through the drain side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 472 has a source end at a bottom of the stack and a drain end at a top of the stack. As in agreement with FIG. 4B, FIG. 4C show vertical column 472 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL249. For example, dielectric layers DL240 is above word line layer WL235 and below word line layer WL236. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W239 connect to memory cells (also called data memory cells). Dummy word line layers DD0, DD1 and DS connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

Figure 4D:
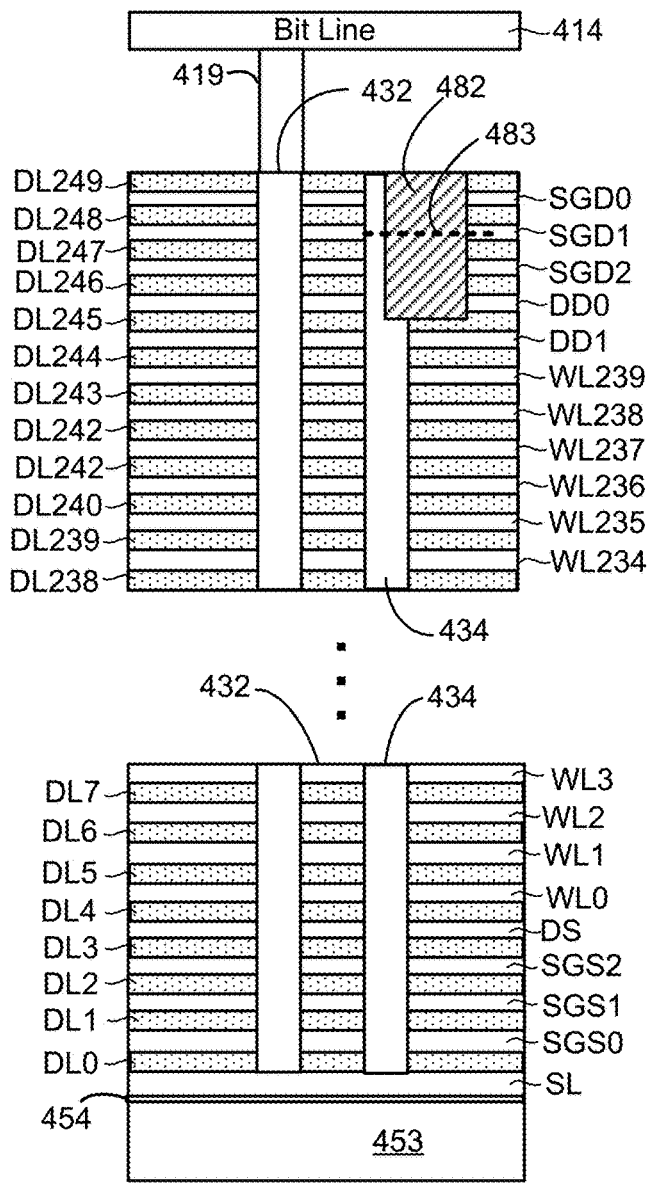
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 480, 482, 484, 486 and 488) occupy space that would have been used for a portion of the memory holes/vertical columns/NAND stings. For example, isolation region 482 occupies space that would have been used for a portion of vertical column 434. More specifically, a portion (e.g., half the diameter) of vertical column 434 has been removed in layers SDG0, SGD1, SGD2, and DD0 to accommodate isolation region 482. Thus, while most of the vertical column 434 is cylindrical (with a circular cross section), the portion of vertical column 434 in layers SDG0, SGD1, SGD2, and DD0 has a semi-circular cross section. In one embodiment, after the stack of alternating conductive and dielectric layers is formed, the stack is etched to create space for the isolation region and that space is then filled in with SiO$_2$.

Figure 4E:
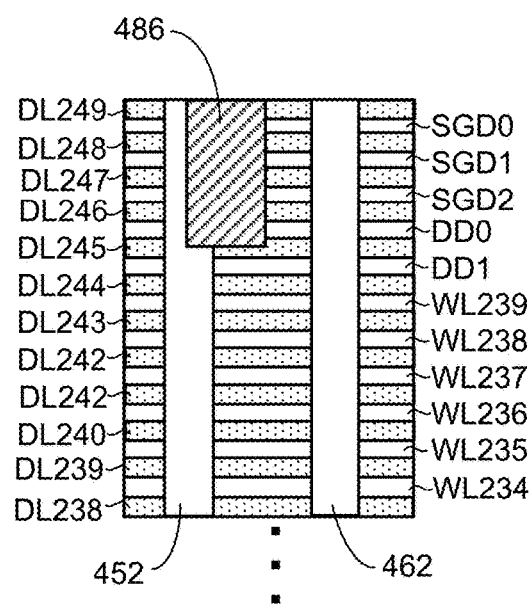
FIG. 4E depicts a cross sectional view of a portion of one embodiment of a block of memory cells.

FIG. 4E depicts a portion of one embodiment of a three dimensional memory structure 202 showing a cross-sectional view along line CC of FIG. 4B. This cross sectional view cuts through vertical columns (NAND strings) 452 and 462 (see FIG. 4B). FIG. 4E shows the same alternating conductive and dielectric layers as FIG. 4C. FIG. 4E also shows isolation region 486 cutting into vertical columns (NAND string) 452.

Figure 4F:
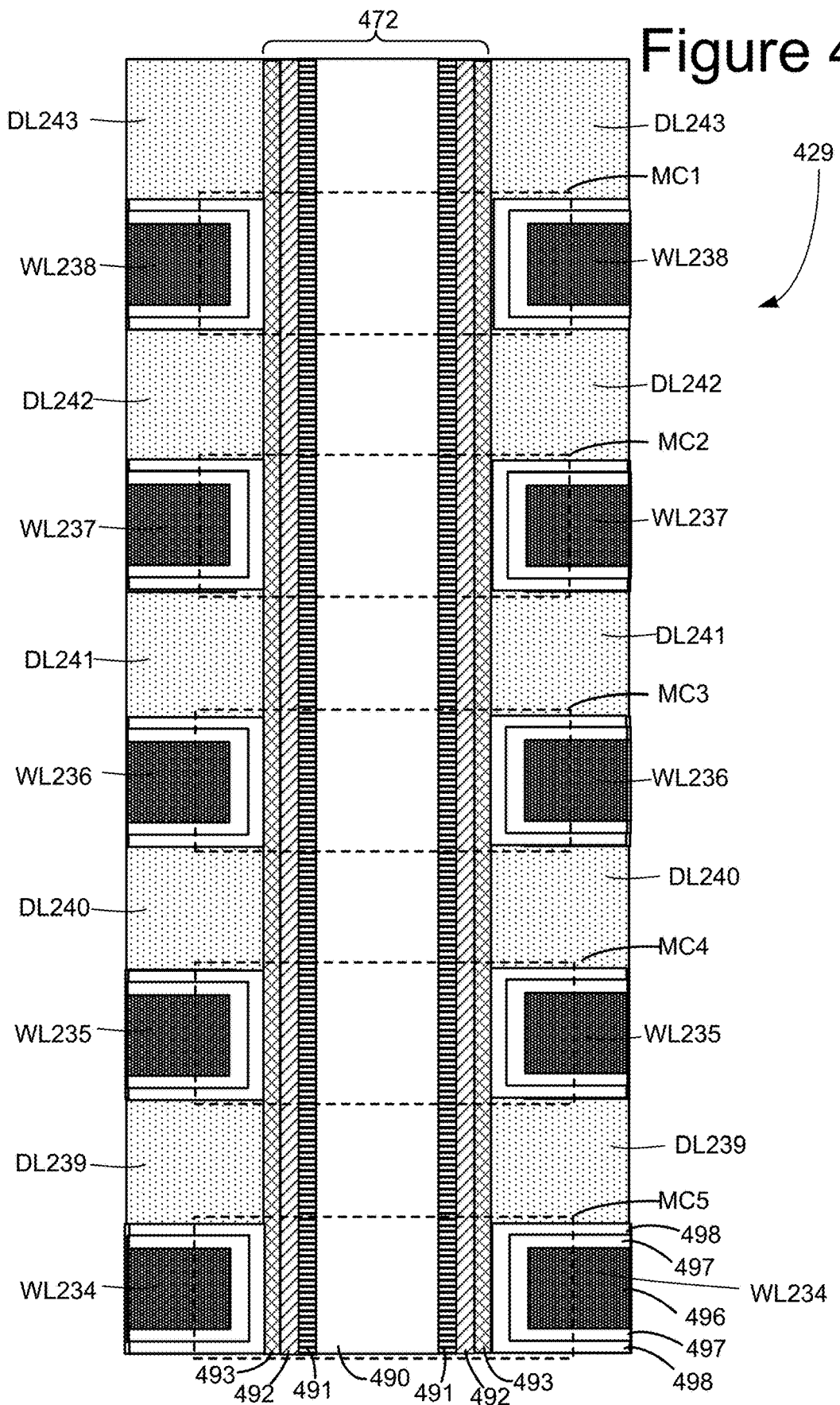
FIG. 4F is a cross sectional view of one embodiment of a vertical column of memory cells.

FIG. 4F depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as SiO$_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4F depicts dielectric layers DLL239, DLL240, DLL241, DLL242 and DLL243, as well as word line layers WLL234, WLL235, WLL236, WLL237, and WLL238. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WLL238 and a portion of vertical column 472 comprise a memory cell MC1. Word line layer WL237 and a portion of vertical column 472 comprise a memory cell MC2. Word line layer WLL236 and a portion of vertical column 472 comprise a memory cell MC3. Word line layer WLL235 and a portion of vertical column 472 comprise a memory cell MC4. Word line layer WLL234 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as Gate Induced Drain Leakage (GIDL).

Figure 4G:
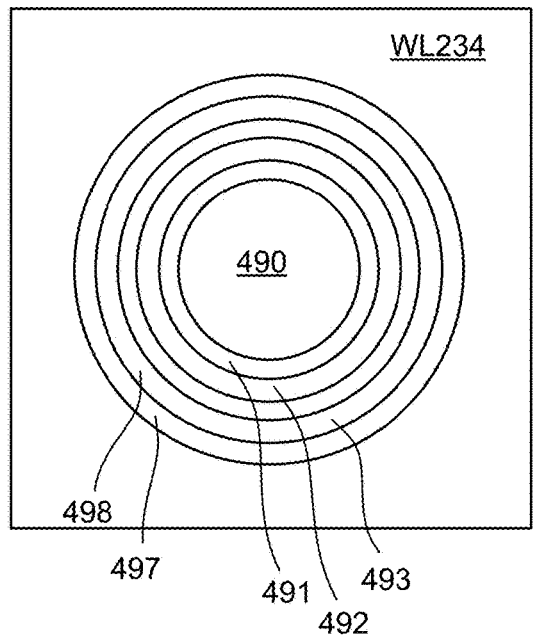
FIG. 4G depicts a cross section of as memory hole that implements a vertical NAND string.

FIG. 4G shows a cross section of vertical column 472 of FIG. 4F, cut through MC5. Thus, FIG. 4G depicts word line layer WL234, inner core 490, channel 491, tunneling dielectric 492, charge trapping layer 493, aluminum oxide layer 497, and blocking oxide layer 498. Thus, the vertical column 472 has a number of annular rings of material.

Figure 4H:
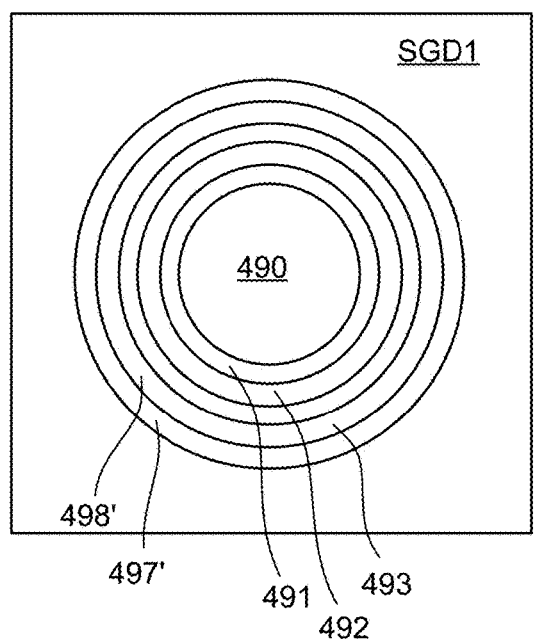
FIG. 4H depicts a cross section of as memory hole that implements a vertical NAND string.

FIG. 4H shows a cross section of vertical column 472 of FIG. 4F, cut through SGD1. Thus, FIG. 4H depicts drain side select line layer SGD1, inner core 490, channel 491, tunneling dielectric 492, charge trapping layer 493, aluminum oxide layer 497, and blocking oxide layer 498. The annular rings are intact in what is referred to herein as a "full-circle" select transistor.

Figure 4I:
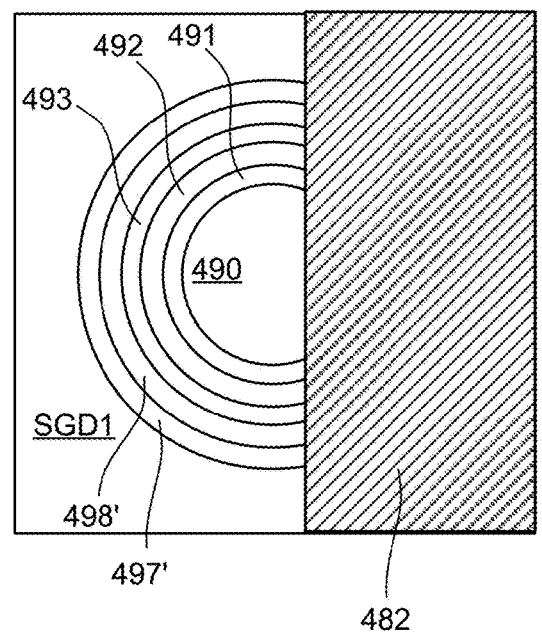
FIG. 4I depicts a cross section of as memory hole that implements a vertical NAND string.

FIG. 4I shows a cross section of vertical column 434 of FIG. 4D, cut through SGD1. Thus, FIG. 4I depicts drain side select line layer SGD1, inner core 490, channel 491, tunneling dielectric 492, charge trapping layer 493, aluminum oxide layer 497, and blocking oxide layer 498. FIG. 4I also shows a portion of isolation region 482. As can be seen in FIG. 4I, the select gate of vertical column 434 is a partial circle due to vertical column (NAND string) 434 intersecting isolation region 482. In some cases, the shape of the vertical column will be approximately a semi-circle. However, the isolation region 482 could intersect more or less than one half of the vertical column 434. In FIG. 4I, the isolation region 482 cuts into the annular rings such that at least one of the annular rings is broken by the isolation region 482. As noted above, either the term "semi-circle select transistor" or the term "partial-circle select transistor" may be used to refer to a select transistor formed in a memory hole that is cut into by an isolation region such as depicted in FIG. 4I.

Figure 4J:
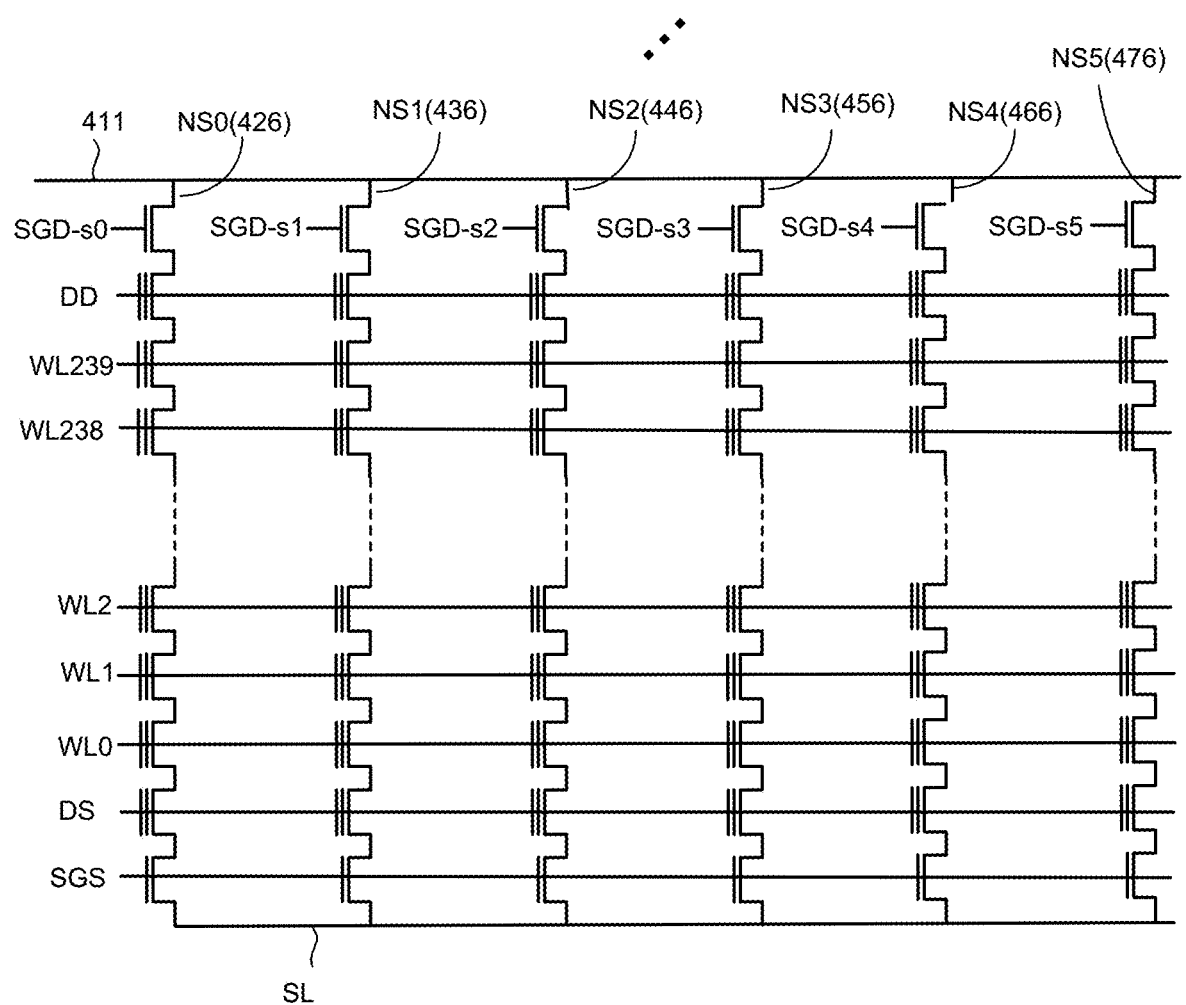
FIG. 4J is a schematic of a plurality of NAND strings in multiple sub-blocks of a same block.

FIG. 4J is a schematic diagram of a portion of the memory array 202 depicted in in FIGS. 4-4I. FIG. 4J shows physical data word lines WL0-WL239 running across the entire block. The structure of FIG. 4J corresponds to a portion 406 in Block 2 of FIG. 4A, including bit line 411. Within the block, in one embodiment, each bit line is connected to six NAND strings. Thus, FIG. 4J shows bit line connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each sub-block separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4J as SGS. Although the select gates SGD-s0, SGD-s1, SGD-s2, SGD-s3, SGD-s4, and SGD-s5 are isolated from each other due to the isolation regions, the data word lines WL0-WL239 of each sub-block are connected together.

The isolation regions (480, 482, 484, 486 and 486) are used to allow for separate control of sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. A sixth sub-block corresponds to those vertical NAND strings controlled by SGD-s5.

FIG. 4J only shows the NAND strings connected to bit line 411. However, a full schematic of the block would show every bit line and six vertical NAND strings connected to each bit line.

Although the example memories of FIGS. 4-4J are three dimensional memory structure that includes vertical NAND strings with charge-trapping material, other (2D and 3D) memory structures can also be used with the technology described herein.

Figure 5A:
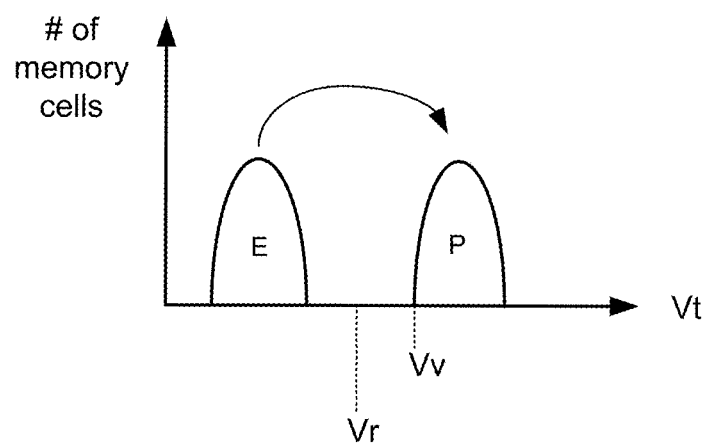
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Figure 5B:
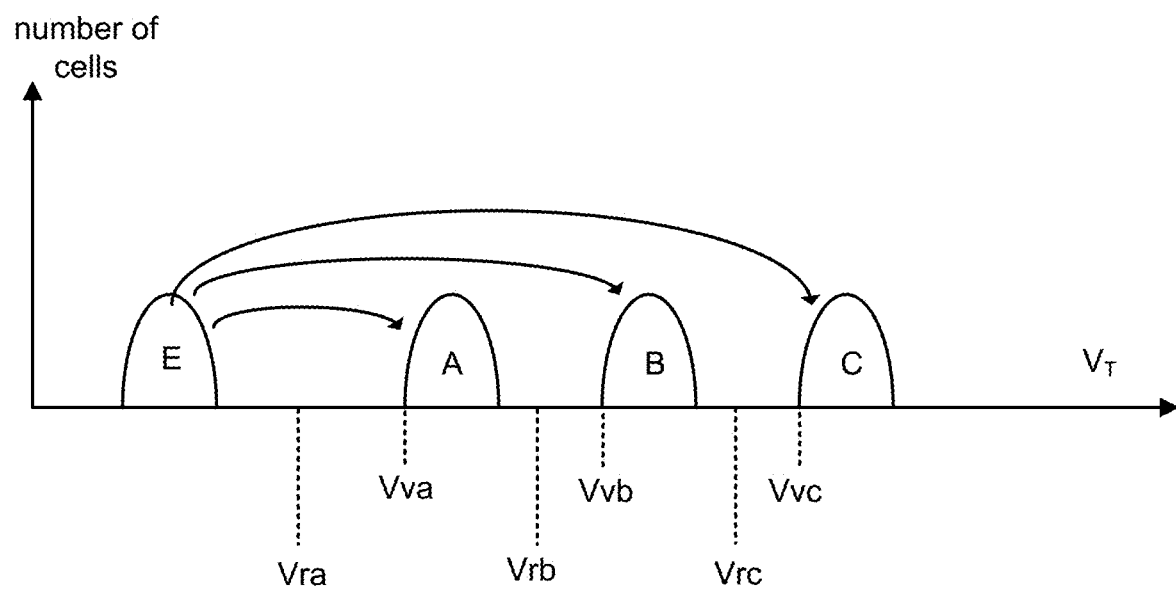
FIG. 5B depicts threshold voltage distributions.

FIGS. 5B-D illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, or five bits of data per memory cell).

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells.

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5C shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 5C also shows a number of verify reference voltages. In some embodiments, at least some of the states have two verify voltages, which are referred to as a verify low voltage and a verify high voltage. The verify high voltage is a final target voltage for the data state. The verify low voltage is used to determine when to slow the speed of programming when a memory cell is close to the final target voltage to help achieve more compact Vt distributions, while still allowing for overall fast programming. Slowing the speed of programming may be achieved by applying a slightly higher voltage to the bit line than for full programming speed. For example, a full program enable voltage may be 0V and a slow program enable voltage (also referred to as QPW) may be 1 V. In each case, the bit line voltage may be passed to the NAND channel. During programming a program voltage is applied to the control gate of a selected memory cell. Therefore, the QPW voltage results in a slightly lower voltage across the selected memory cell than the full program enable voltage.

The verify high voltages are VvA_h, VvB_h, VvC_h, VvD_h, VvE_h, and VvF_h. The verify low voltages are VvA_l, VvB_l, VvC_l, VvD_l, VvE_l, and VvF_l. In the embodiment depicted in FIG. 5C, there is only a final verify voltage for the G-state, which is simply referred to as VvG. Note that the example of FIG. 5B can be modified to include verify low voltages for some of the states, such as the A-state and the B-state.

In some embodiments, when programming memory cells to data state A, the system will test whether those memory cells have a threshold voltage greater than or equal to either VvA_l or VvA_h. If the memory cell has a threshold voltage greater than or equal to VvA_h, then the memory cell is locked out from further programming. If the memory cell has a threshold voltage greater than or equal to VvA_l but less than VvA_h, then the memory cell is programmed at a slower rate during the next program loop. If the memory cell has a threshold voltage below VvA_l, then the memory cell continues to receive full programming during the next program loop. Similar reasoning applies to the other data states, with the exception of the G-state, for which there is no slow programming. In an embodiment, a memory cell is locked out from programming by applying an inhibit voltage to its bit line. In an embodiment, if a memory cell is to receive full programming its bit line receives a full program enable voltage. In an embodiment, if a memory cell is to receive slow programming its bit line receives a voltage that has a magnitude that is between the full program enable voltage and the inhibit voltage. Example bit line voltages are 0 V for full programming, 1.0 V for slow programming, and 2.5 V for inhibiting programming.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 5C) or verify operation (e.g. see verify target levels VvA_l, VvB_l, VvC_l, VvD_l, VvE_l, VvF_l, VvA_h, VvB_h, VvC_h, VvD_h, VvE_h, VvF_h, and VvG, of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Note that in some embodiments, the threshold voltage distributions for a population of memory cells storing four bits of data per memory cell do not overlap and are separated from each other. The threshold voltage distributions of FIG. 5D will include read reference voltages and verify reference voltages, as discussed above. In some embodiments, there are both verify low and verify high reference voltage for at least some of the states. However, some states might not be subject to the slow programming discussed above, and hence do not have a verify low reference voltage.

When using four bits per memory cell, the memory can be programmed using the full sequence programming discussed above, or multi-pass programming processes known in the art. Each threshold voltage distribution (data state) of FIG. 5D corresponds to predetermined values for the set of data bits.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 may also include determining whether a memory cell should receive slow programming during the next program loop, as opposed to full programming. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state. For example, a memory cell may be locked out if it reaches a verify high voltage. If a memory cell has a Vt between the verify low voltage and the verify high voltage, then the memory cell may be marked for slow programming the next program loop. In one embodiment, one or more data latches in the managing circuit 302 are used to indicate whether a memory cell is locked out, is to receive slow programming, or is to receive full programming.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another iteration (steps 604-626) of the programming process of FIG. 6 is performed.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to or near a bit line to generate a first GIDL current. A second GIDL voltage may be created between two terminals of a select transistor (e.g., source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 7:
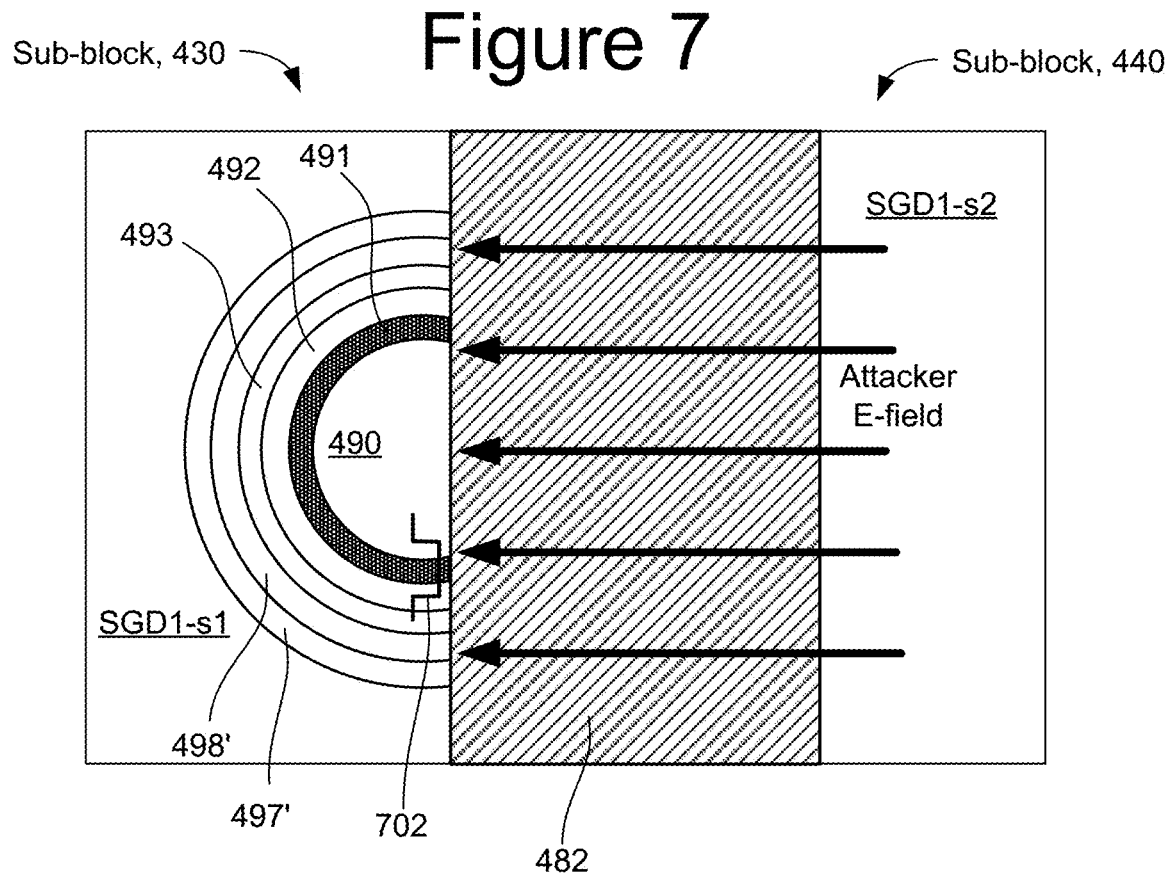
FIG. 7 shows a cross section of vertical column 434 of FIG. 4D, cut along line 483.

FIG. 7 shows a cross section of vertical column 434 of FIG. 4D, cut along line 483. Thus, FIG. 7 depicts a portion of drain side select line layer SGD1-s1, inner core 490, channel 491, tunneling dielectric 492, charge trapping layer 493, aluminum oxide layer 497, and blocking oxide layer 498. FIG. 7 also shows a portion of isolation region 482, as well as a portion of the adjacent drain side select line layer SGD1-s2. During memory operations there will be times when a different voltage is applied to drain side select line layer SGD1-s1 than is applied to drain side select line layer SGD1-s2. Note that drain side select line layer SGD1-s1 is part of sub-block 430 and drain side select line layer SGD1-s is part of sub-block 440. A select voltage may be applied to a drain side select line layer to select the associated sub-block, whereas an unselect voltage may be applied to the drain side select line layer to not select the associated sub-block.

An example will be described in which a higher voltage is applied to SGD-s2 than is applied to SGD-s1, which will result in an E-field as indicated in FIG. 7. The E-field is referred to in FIG. 7 as an "attacker E-field" because the E-field may result in NSI to the select transistor in sub-block 430. Recall that region SGD-s1 serves as a control gate for the select transistor in sub-block 430. Also, region SGD-s1 may be referred to herein as a select line. In this example, the voltage applied to region SGD-s1 is intended to keep the select transistor in sub-block 430 off. However, it is possible for the select transistor in sub-block 430 to weakly turn on, or to at least have significant leakage current, due to the attacker E-field. A parasitic transistor 702 is depicted near the channel 491. One way to analyze the NSI is that the parasitic transistor 702 may become conductive as a result of the voltage applied to SGD-s2. Therefore, the parasitic transistor 702 can result in significant leakage current for the select transistor in sub-block 430. This leakage current can result even if the voltage on SGD-s1 is kept sufficiently low to keep the select transistor in sub-block 430 off absent the NSI.

During a memory operation such as a program operation, the drain side select transistors in an unselected sub-block (e.g., sub-block 430) are kept off to isolate the channel region 491 of memory cells on unselected NAND strings from the bit line. One technique for keeping the drain side select transistors off is to apply a suitable voltage to the drain side select line. Boosting voltages are applied to unselected word lines to boost the channel potential of the memory cells on the unselected NAND strings. However, if the drain side select transistor turns weakly on, or has significant leakage current, then the boosting of the channel potential of the memory cells on the unselected NAND string will be compromised. For example, charge from the NAND channel can leak to the bit line. Therefore, the attacker E-field could possibly lead to program disturb. The attacker E-field can also lead to problems during sensing operations. For example, a leakage current between a select transistor and a bit line can negatively impact the sensing of memory cells.

Techniques are disclosed herein for mitigating the impact of the attacker E-field. In some embodiments, the voltage on a first set of the bit lines is boosted by floating those bit lines while the voltage on a second set of bit lines is raised to couple up the voltage on the first set of bit lines. In some cases, the voltage on the first set of the bit lines is boosted to a voltage that is not practical to achieve by a direct application of a voltage to the bit lines. In some embodiments, the voltage on a set of the bit lines is boosted to a voltage that is higher than a nominal program inhibit voltage, which reduces or eliminates leakage current in semi-circle drain side select transistors. Also, the semi-circle drain side select transistors in unselected sub-blocks are kept off. Therefore, program disturb is reduced or eliminated.

Figure 8:
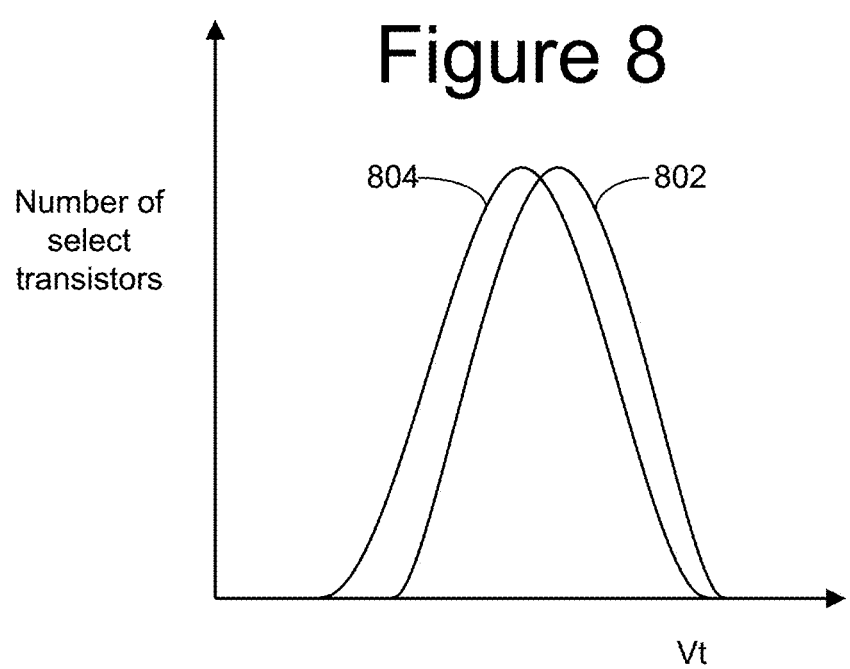
FIG. 8 depicts threshold voltage distributions for select transistors.

FIG. 8 depicts threshold voltage distributions for select transistors. Distribution 802 is for an embodiment of full-circle select transistors. Distribution 804 is for an embodiment of semi-circle select transistors. The distributions depict the tendency for the semi-circle select transistors to have a lower Vt than the full-circle select transistors due to NSI. Thus, there is an apparent downshift in the Vt of the semi-circle select transistors due to NSI.

Figure 9A:
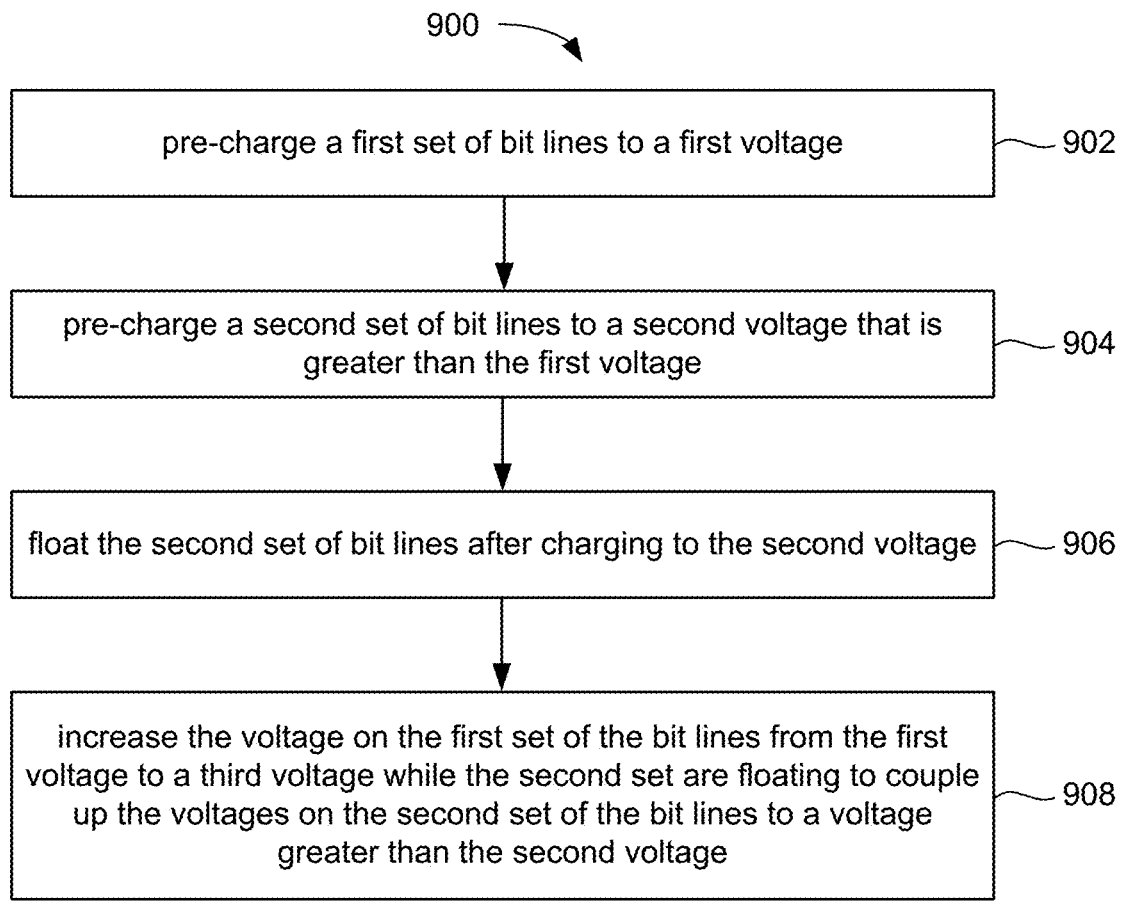
FIG. 9A is a flowchart of one embodiment of a process of operating non-volatile storage.

FIG. 9A is a flowchart of one embodiment of a process 900 of operating non-volatile storage. The process 900 may be used to mitigate NSI to select gates such as semi-circle select gates. The process 900 may be used to program memory cells in the three-dimensional memory structure discussed in FIGS. 4-4I, but is not limited thereto. The process may be performed by a control circuit (e.g., one or more of system control logic 260, column control 210, row control 220, memory controller 120). In one embodiment, the process 900 is used during a program operation. In one embodiment, the process 900 is used during a sensing operation (e.g., read or verify). In some embodiments, the process 900 is performed during program loops for which QPW is not used, but is not used for program loops for which QPW is used.

Process 900 refers to a first set of bit lines and a second set of bit lines. In an embodiment of process 900, the first set of bit lines are used to couple up a voltage on the second set of bit lines. The coupling up of the voltage on the second set of bit lines may mitigate NSI to semi-circle select transistors. In one embodiment, the second set of bit lines are connected to semi-circle select transistors in a selected sub-block. Therefore, NSI to semi-circle select transistors in a selected sub-block may be mitigated. In one embodiment, the second set of bit lines are connected to semi-circle select transistors in an unselected sub-block. Therefore, NSI to semi-circle select transistors in an unselected sub-block may be mitigated.

Step 902 includes pre-charging the first set of bit lines to a first voltage. In one embodiment, the first voltage is a program enable voltage. In an embodiment, the first voltage is ground (e.g., Vss). In an embodiment, Vss is provided to the memory die 200 or control die 211 by, for example, memory controller 120 or host 102.

Step 904 includes pre-charging the second set of bit lines to a second voltage. The second voltage has a greater magnitude than the first voltage. In one embodiment, the second voltage is about 2.5V. In one embodiment, the second voltage is less than or equal to a supply voltage that is provided to the memory die 200 or control die 211 by, for example, memory controller 120 or host 102. For example, a supply voltage referred to as Vcc may be provided to the die 200, 211. In one embodiment, the second voltage is less than or equal to Vcc. In one embodiment, the second voltage is a program inhibit voltage.

Step 906 includes floating the second set of bit lines after charging them to the second voltage. Embodiments of a circuit 1200 and techniques for operating the circuit 1200 to float the bit lines are discussed below. However, floating the bit lines is not limited to using circuit 1200.

Step 908 includes increasing the voltage on the first set of bit lines from the first voltage to a third voltage while the second set are floating to couple up the voltage on the second set to a voltage greater than the second voltage. In some embodiments, the second voltage and the third voltage have the same magnitude. In one embodiment, the first set of bit lines are raised from a program enable voltage to a nominal program inhibit voltage to couple up the second set of bit lines to a voltage that is greater than the nominal program inhibit voltage. For example, the second set of bit lines may be coupled up from about 2.5V to about 5V. In some embodiments, the final voltage on the second set of bit lines is greater than the aforementioned supply voltage (e.g., Vcc) that is provided to the memory die 200 or control die 211. Therefore, the second set of bit lines may be boosted to a voltage that is greater than the supply voltage (e.g., Vcc) without having to generate a voltage that is greater than the supply voltage (e.g., Vcc).

Figure 9B:
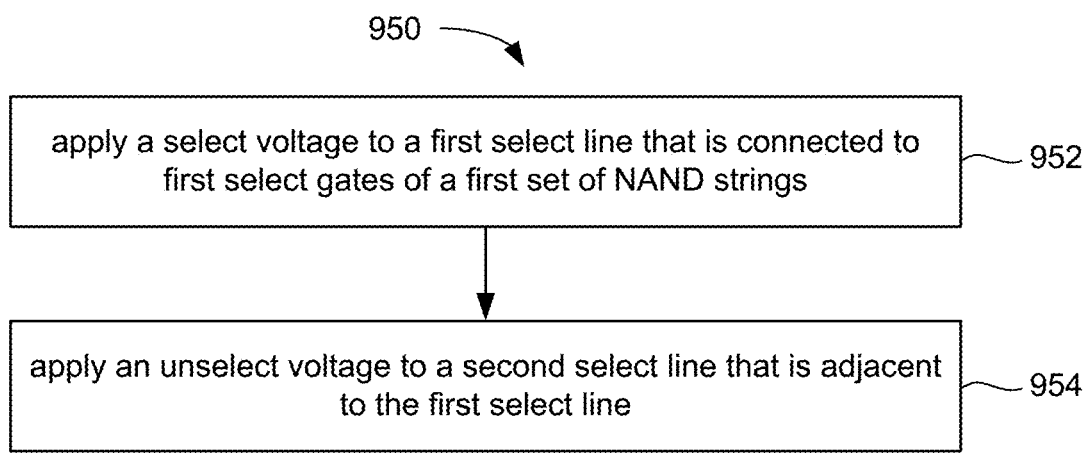
FIG. 9B is a flowchart of one embodiment of a process of providing voltages to select lines.

FIG. 9B is a flowchart of one embodiment of a process 950 of operating select transistors. In one embodiment, the process 950 is used in combination with process 900. In one embodiment, process 950 is used during a program operation. However, process 950 may also be used during a sensing operation. Step 952 includes applying a select voltage to a first select line. The first select line is connected to select gates of a first set of NAND strings. In an embodiment, the first set of NAND strings are in a first sub-block. The first sub-block may be one that is selected for a memory operation which could include a program, erase, or read. The first select line may be a drain side select line, with the select gates being drain side select transistors on the NAND strings. The first voltage may be a select voltage. The select voltage may be about 2.6 V. In one embodiment, the select voltage is about 2.1 V. In one embodiment, the magnitude of the select voltage depends on whether QPW is being used for the present loop of a program operation.

Step 954 includes applying an unselect voltage to a second select line. The second select line is connected to select gates of a second set of NAND strings. In an embodiment, the second set of NAND strings are in a second sub-block that is adjacent to the first sub-block. Thus, the second select line may be adjacent to the first select line. Moreover, there may be an isolation region between the select lines. The second sub-block may be one that is not selected for the memory operation. The second select line may be a drain side select line, with the select gates being drain side select transistors on the second set of NAND strings. The second voltage may be a unselect voltage. The unselect voltage may be about 0 V.

Figure 10A:
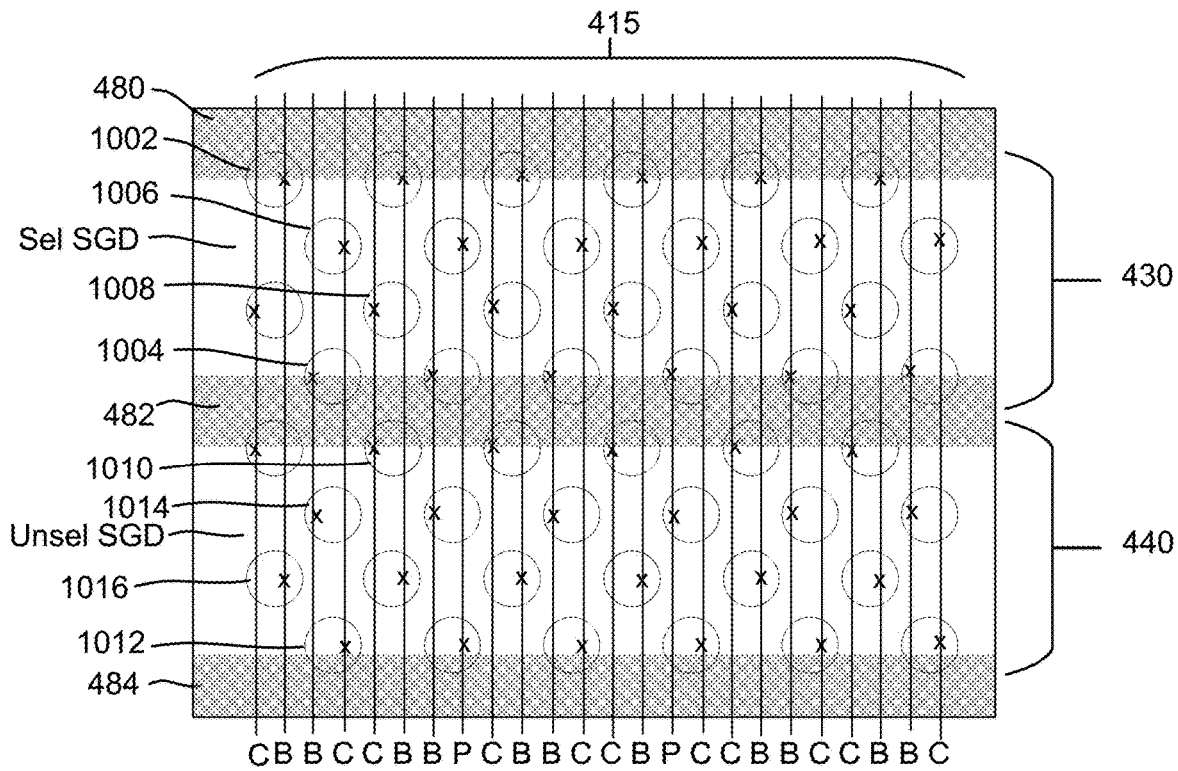
FIGS. 10A and 10B depict examples of using one set of bit lines to boost voltages on another set of bit lines.
Figure 10B:
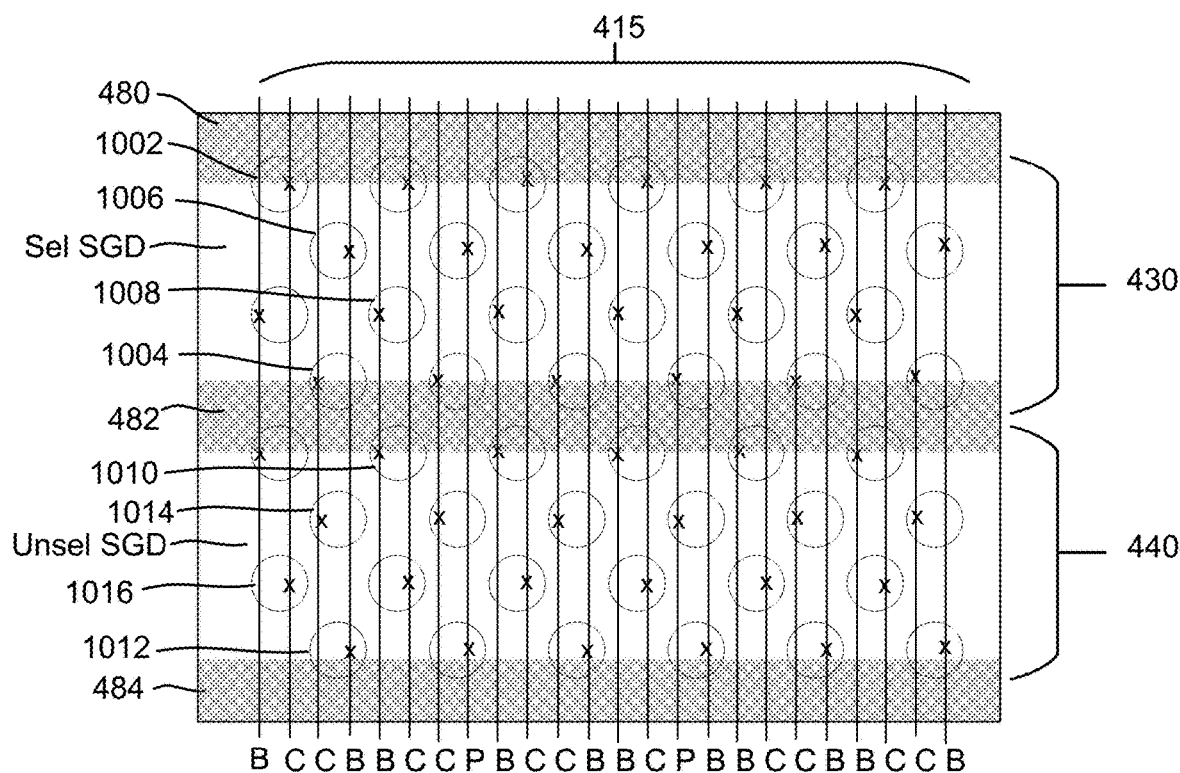

Process 900 included using one set of bit lines to boost the voltages on another set of bit lines. FIGS. 10A and 10B depict examples of using one set of bit lines to boost voltages on another set of bit lines. FIGS. 10A and 10B show sub-blocks 430 and 440, which were depicted in FIG. 4B. The bit lines 415 that extend over the sub-blocks are shown. In both FIG. 10A and 10B sub-block 430 is the selected sub-block (Sel SGD) and sub-block 440 is an unselected sub-block (Unsel SGD). In one embodiment, about 2.6V is applied to the select line in sub-block 430 and about 0V is applied to the select line in sub-block 440.

The letters B, C, and P are used indicate the treatment of the bit lines. In the following example, the memory cells in sub-block 430 are being programmed. Therefore, the memory cells in sub-block 440 are inhibited from programming. Also, as memory cells are locked out during the program operation, certain memory cells in the selected sub-block 430 will also be inhibited from programming. In this example, the letter P indicates that a memory cell in sub-block 430 that is on a NAND string connected to the bit line with the P is currently undergoing programming. A relatively few bit lines have the letter P to represent a case in which most of the memory cells have already reached their respective data states. In some cases, program disturb is at its most severe in this situation. Note that the magnitude of the program voltage is typically stepped up with each loop of a program operation (see FIG. 6). Therefore, this higher program voltage may result in more program disturb for later program loops. Other factors may also lead to a higher risk of program disturb in later program loops. The letters B and C are used for inhibited bit lines. Memory cells in the selected sub-block 430 that are on a NAND string connected to an inhibited bit line are presently inhibited from programming. The letter B is used to refer to an inhibited bit line that is to receive boosting from one or more neighbor bit lines. The boosting could come from an immediate neighbor, but is not limited to an immediate neighbor. The letter C is used to refer to an inhibited bit line that is to provide boosting to one or more neighbor bit lines. Referring back to FIG. 9A, the letter C may correspond to the first set of bit lines (see steps 902, 908). The letter B may correspond to the second set of bit lines (see steps 904, 906, 908). Also note that the selected sub-block 430 may correspond to the first select line and first set of NAND strings (see step 952 in FIG. 9B). The unselected sub-block 440 may correspond to the second select line and second set of NAND strings (see step 954 in FIG. 9B).

Referring again to FIG. 10A, in an embodiment, the bit lines to receive boosting include bit lines connected to semi-circle select transistors in the selected sub-block (e.g., MH 1002, 1004), whereas the bit lines to provide the boosting include bit lines connected to full-circle select transistors in the selected sub-block (e.g., MH 1006, 1008).

Referring to FIG. 10B, in an embodiment, the bit lines to receive boosting include bit lines connected to semi-circle select transistors in the unselected sub-block (e.g., MH 1010, 1012), whereas the bit lines to provide the boosting include bit lines connected to full-circle select transistors in the unselected sub-block (e.g., MH 1014, 1016).

FIGS. 10A and 10B depict one possible pattern for bit line boosting for the select transistors. Other patterns are possible. With reference to FIG. 10B, there may be an attacker E-field to the semi-circle select transistors in sub-block 440 that border sub-block 430 (e.g., in MH 1010). However, the select line in the sub-block on the other side of sub-block 440 (not depicted in FIG. 10B) may be biased to the same voltage as sub-block 440. Thus, semi-circle select transistors in sub-block 440 that border this other unselected sub-block (e.g., in MH 1012) might not be subject to NSI. Hence, the bit lines connected to such semi-circle select transistors may, in some embodiments, be used to provide the boost (C).

FIGS. 10A and 10B depict one possible arrangement for the connections between the bit lines and the select transistors. Other arrangements are possible. With other arrangements the pattern of bit lines to be boosted (B) and bit lines to provide the boosting (C) may be other than depicted in FIGS. 10A and 10B. In one embodiment, the pattern alternates such that each bit line to be boosted (B) has an immediate neighbor that provides the boosting (C), with the caveat that some bit lines may receive a program enable voltage (P). In such an embodiment, the basic pattern for a set of inhibited bit lines would be BCBCBCBC.

Figure 11:
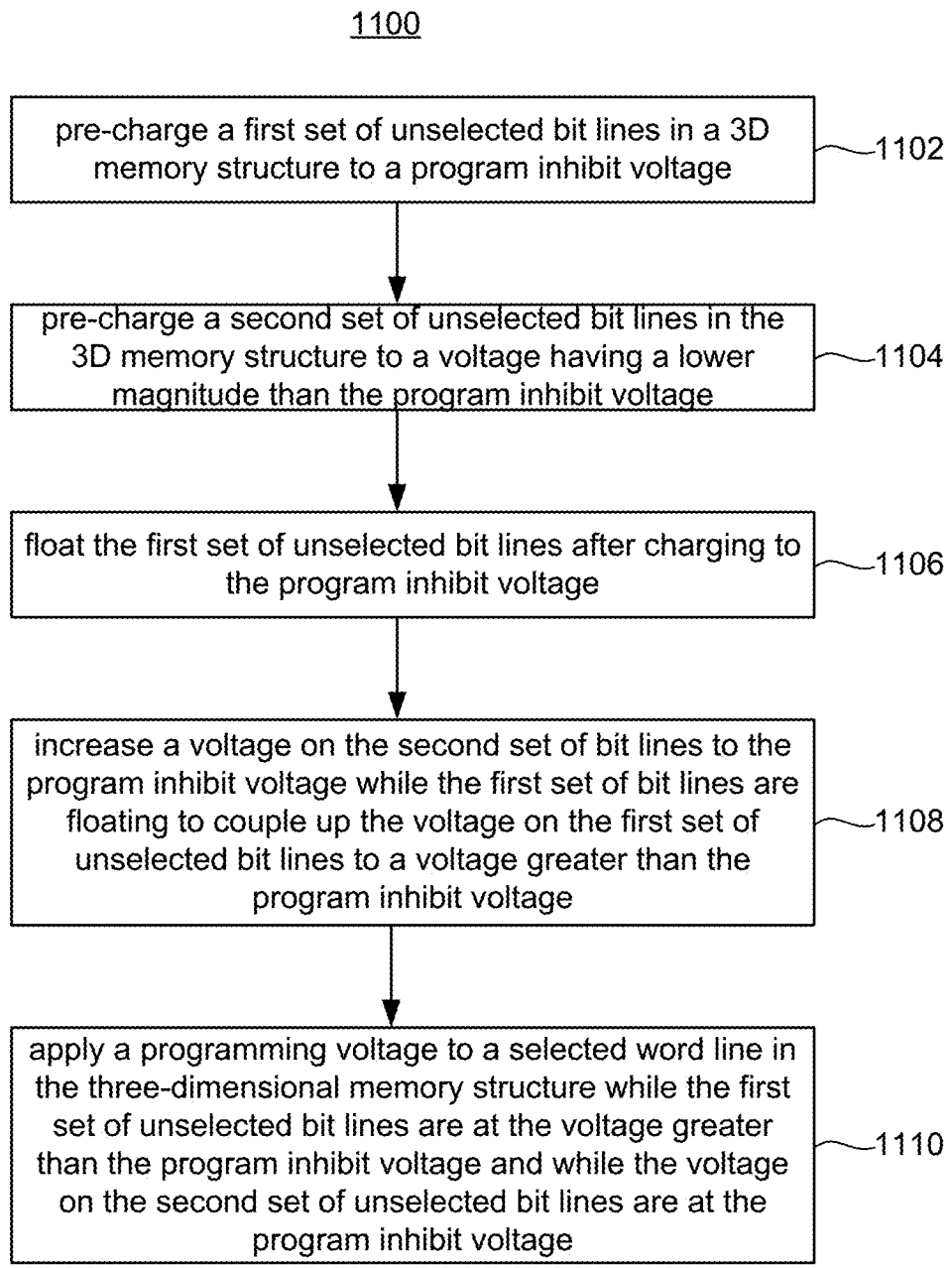
FIG. 11 is a flowchart of one embodiment of a process of programming memory cells in a three-dimensional memory structure.

FIG. 11 is a flowchart of one embodiment of a process 1100 of programming memory cells in a three-dimensional memory structure. The process 1100 may be used to mitigate NSI to select gates such as semi-circle select gates. The process 1100 may be used to program memory cells in the three-dimensional memory structure discussed in FIGS. 4-4I, but is not limited thereto. Process 1100 provides further details of one embodiment of process 900. Process 1100 involves using one set of bit lines to boost the voltages on another set of bit lines.

Step 1102 includes pre-charging a first set of unselected bit lines in a 3D memory structure to a program inhibit voltage. In process 1100, the first set of unselected bit lines are those to receive boosting. For example, the first set could be those labeled with B in FIG. 10A or, alternatively, FIG. 10B.

Step 1104 includes pre-charging a second set of bit lines in the 3D memory structure to a voltage having a lower magnitude than the program inhibit voltage. In one embodiment, the voltage is a program enable voltage. In process 1100, the second set of unselected bit lines are those to provide the boosting. For example, the second set could be those labeled with C in FIG. 10A or, alternatively, FIG. 10B.

Step 1106 includes floating the first set of bit lines after charging them to the program inhibit voltage.

Step 1108 includes increasing the voltage on the second set of bit lines to the program inhibit voltage while the first set are floating to couple up the voltage on the first set to a voltage greater than the program inhibit voltage.

Step 1110 includes applying a programming voltage to a selected word line in the 3D memory structure while the first set of bit lines are at the voltage greater than the program inhibit voltage and while the second set of unselected bit lines are at the program inhibit voltage.

Figure 12A:
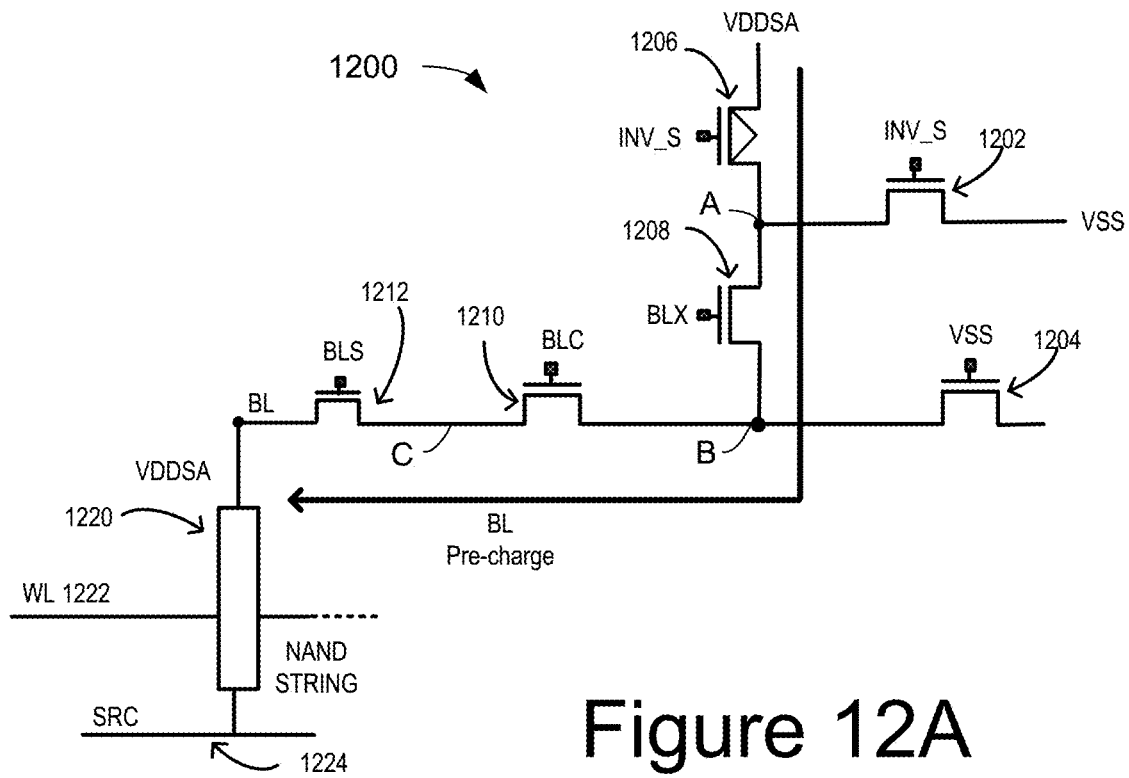
FIGS. 12A and 12B are schematic diagrams of one embodiment of a circuit that pre-charges a bit line.

FIG. 12A is a schematic diagram of one embodiment of a circuit 1200 that pre-charges a bit line. The circuit 1200 may be used in process 900 or 1100. There may be one such circuit 1200 for each bit line. The circuit 1200 may be a part of the sense amplifier 230. The circuit 1200 has two different bit line pre-charge paths. FIG. 12A shows a pre-charge path through the series connection of transistors 1206, 1208, 1210, 1212 to the bit line (BL). The bit line is pre-charged to a nominal program inhibit voltage, VDDSA. In an embodiment, VDD_SA has a magnitude that is less than or equal to a supply voltage (e.g., Vcc) that is provided to the memory die 200 or control die 211. For example, VDDSA may be about 2.5V, with Vcc being about 3.3V. However, VDDSA and Vcc may be higher or lower than these examples.

Figure 12B:
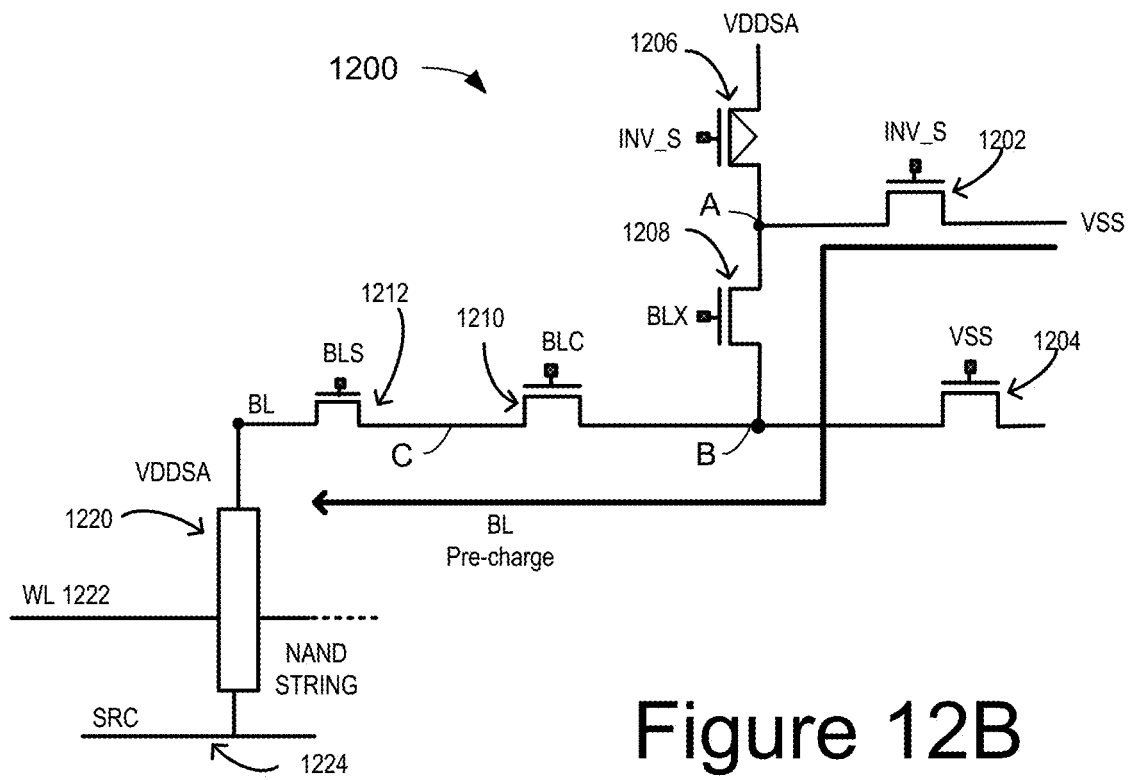

FIG. 12B shows the circuit 1200 of FIG. 12A being used to charge the bit line to a program enable voltage, VSS (e.g., 0V). A pre-charge path through the series connection of transistors 1202, 1208, 1210, 1212 to the bit line (BL) is depicted in FIG. 12B. In some embodiments, transistor 1206 is on and transistor 1202 is off (with transistors 1208, 1210, 1212 on) to charge the bit line to VDDSA (see FIG. 12A). Transistor 1206 is off and transistor 1202 is on (with transistors 1208, 1210, 1212 on) to charge the bit line to VSS (see FIG. 12B). Note that transistor 1202 is an NMOS device and transistor 1206 is a PMOS device. Therefore, transistor 1202 and transistor 1206 may be driven by the same signal (INV_S).

FIGS. 12A and 12B show that the bit line is connected to a NAND string 1220. One of the word lines (WL) 1222 is depicted, as is the source line (SRC) 1224. If the word line 1222 is a selected word, a program voltage may be applied to the word line 1222. If the word line 1222 is an unselected word, a boosting voltage may be applied to the word line

1222. FIGS. 12A and 12B also show transistor 1204 which may connect to other parts of the sense amplifier, such as a sensing node.

Figure 13:
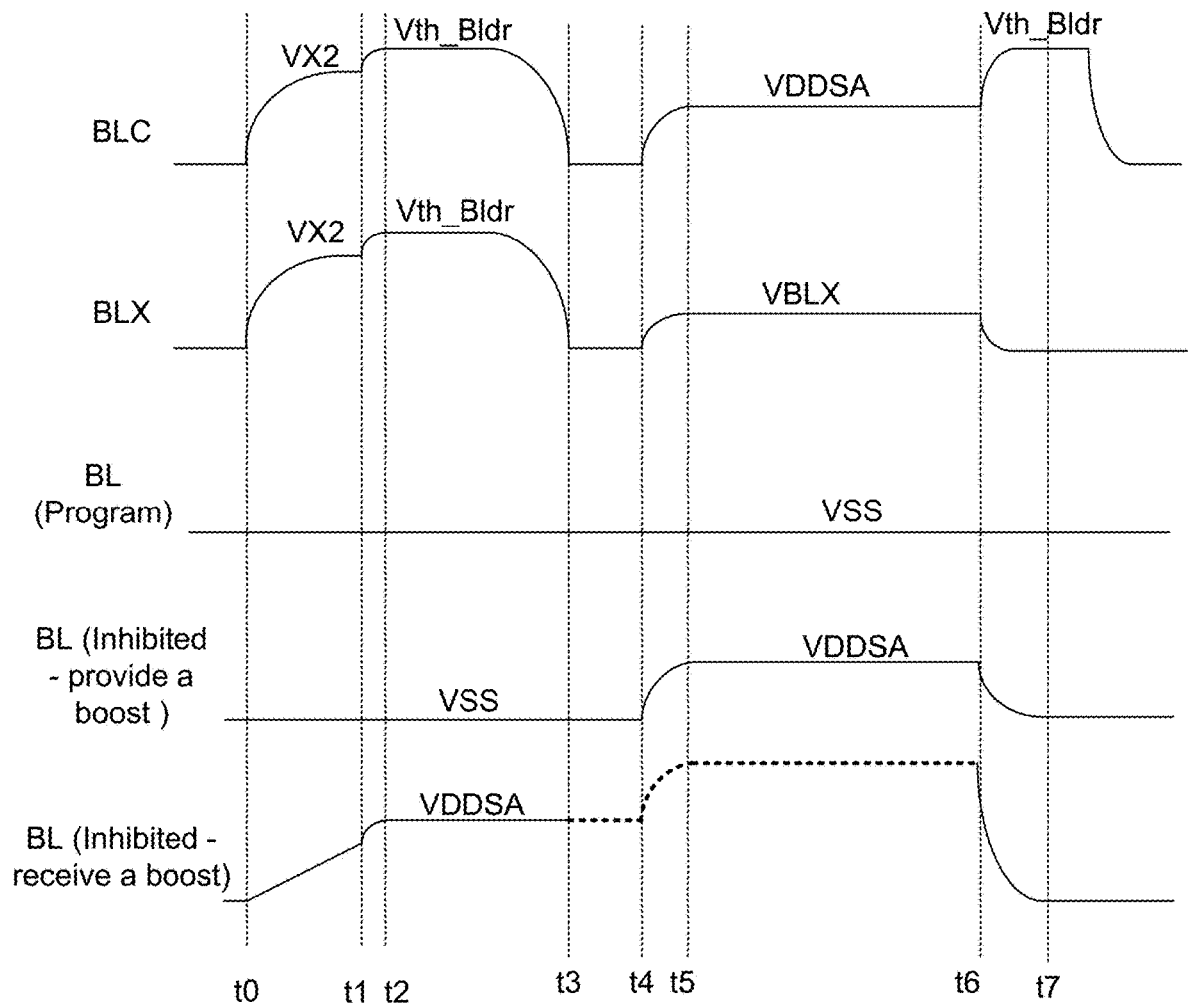
FIG. 13 shows timing of voltage applied to some of the transistors of the circuit in FIGS. 12A and 12B.

FIG. 13 shows timing of voltage applied to some of the transistors of the circuit 1200 in FIGS. 12A and 12B. Specifically, the voltage BLX that is applied to transistor 1208 and the voltage BLC that is applied to transistor 1210 is depicted. FIG. 13 also depicts the voltages on three different sets of bit lines. One set of bit lines are bit lines to receive a program enable voltage. The other two sets are both to eventually receive a program inhibit voltage. Of these two sets, one set is to receive a boost to the bit line voltage, with the other set providing the boost. As one example, the bit lines that receive the boost could be inhibited bit lines that connect to semi-circle select transistors in an unselected sub-block, whereas the bit lines that provide the boost could be inhibited bit lines that connect to full-circle select transistors in the unselected sub-block (see FIG. 10B). As one example, the bit lines that receive the boost could be inhibited bit lines that connect to semi-circle select transistors in a selected sub-block, whereas the bit lines that provide the boost could be inhibited bit lines that connect to full-circle select transistors in the selected sub-block (see FIG. 10A).

Between t0 and t1 the voltages BLX and BLC are increased to VX2. With reference to FIG. 12A, this will turn on transistors 1208 and 1210, respectively. Also, transistors 1206 and 1212 will be on, with transistor 1202 off. Therefore, the bit lines to receive the boost will pre-charge to a voltage somewhat less than VDDSA. Between t1 and t2 the voltages BLX and BLC are increased from VX2 to Vth_Bldr (e.g., about 5 or 6 V). As a result, the bit lines to receive the boost will pre-charge to VDDSA. FIG. 12A has several nodes labeled in order to discuss voltages at those nodes during operation. Node A is located at the junction of transistors 1202 and 1206. Node B is located at the junction of transistors 1208 and 1210. Node C is located at the junction of transistors 1210 and 1212. At time t2, the voltages at nodes A, B, and C will all be VDDSA (for the circuits connected to bit lines to receive the boost). Likewise, the bit line voltage will be VDDSA. As noted, FIG. 12B depicts the pre-charge path for charging the bit line to VSS. At time t2, the voltage at nodes A, B, and C will all be at VSS for the bit lines being charged to VSS (for the circuits connected to bit lines to provide the boost).

The voltages BLX and BLC are then decreased to a voltage slightly over 0V by t3. When BLC is decreased to about 0V, transistor 1210 will be cut off for the circuits connected to bit lines to receive the boost. Thus, the bit lines to receive the boost will be isolated from their respective charging circuits 1200. Hence, at t3 the bit lines that are to receive a boost are floating. Those bit lines will remain floating until t6. However, for the bit lines being pre-charged to VSS, transistor 1210 will stay on, due to BLX being somewhat greater than VSS.

Between t4 and t5 BLC is increased to VDDSA. Also, BLX is increased to VBLX. Thus, transistors 1210 and 1208 will again both be conducting. Moreover, at t4 a change in made to the charging circuits 1200 for the bit lines that provide the boost. At t4, the charging path is changed from that of FIG. 12C to that of FIG. 12B. This change may be made by inverting the signal INV_S that is applied to transistors 1202 and 1206. Thus, this set of bit lines are now charged to VDDSA, as indicated in FIG. 13 between t4 and t5. In order to charge those bit lines to VDDSA transistor 1202 will be off and transistor 1206 will be on. Furthermore, since the bit line to receive a boost are floating at t4, those bit lines will have their voltages boosted between t4 and t5. The amount of boosting will depend on the coupling ratio between the bit lines. In one embodiment, the bit lines are boosted to about 2*VDDSA. Note that, for a charging circuit 1200 connected to a floating bit line, transistor 1210 will remain off between t4 and t6. Hence, the charging path from transistor 1206 to the bit line is not used for such floating bit lines between t4 and t6. Therefore, it is possible to couple up such floating bit lines to greater than VDDSA. In some embodiments, these floating bit lines are coupled up to greater than a supply voltage (e.g., Vcc). Thus, the circuit 1200 and its operation allow a set of the bit lines to be charged to a voltage greater than a supply voltage (e.g., Vcc).

Note that between t4 and t6 the selected bit lines will continue to be charged to VSS. At t6, BLX is brought done to a low voltage, while BLC is raised to a high voltage. As a result, the voltages on the inhibited bit lines return to a low voltage by t7. Moreover, the bit lines that received the boost are no longer floating after t6.

Figure 14:
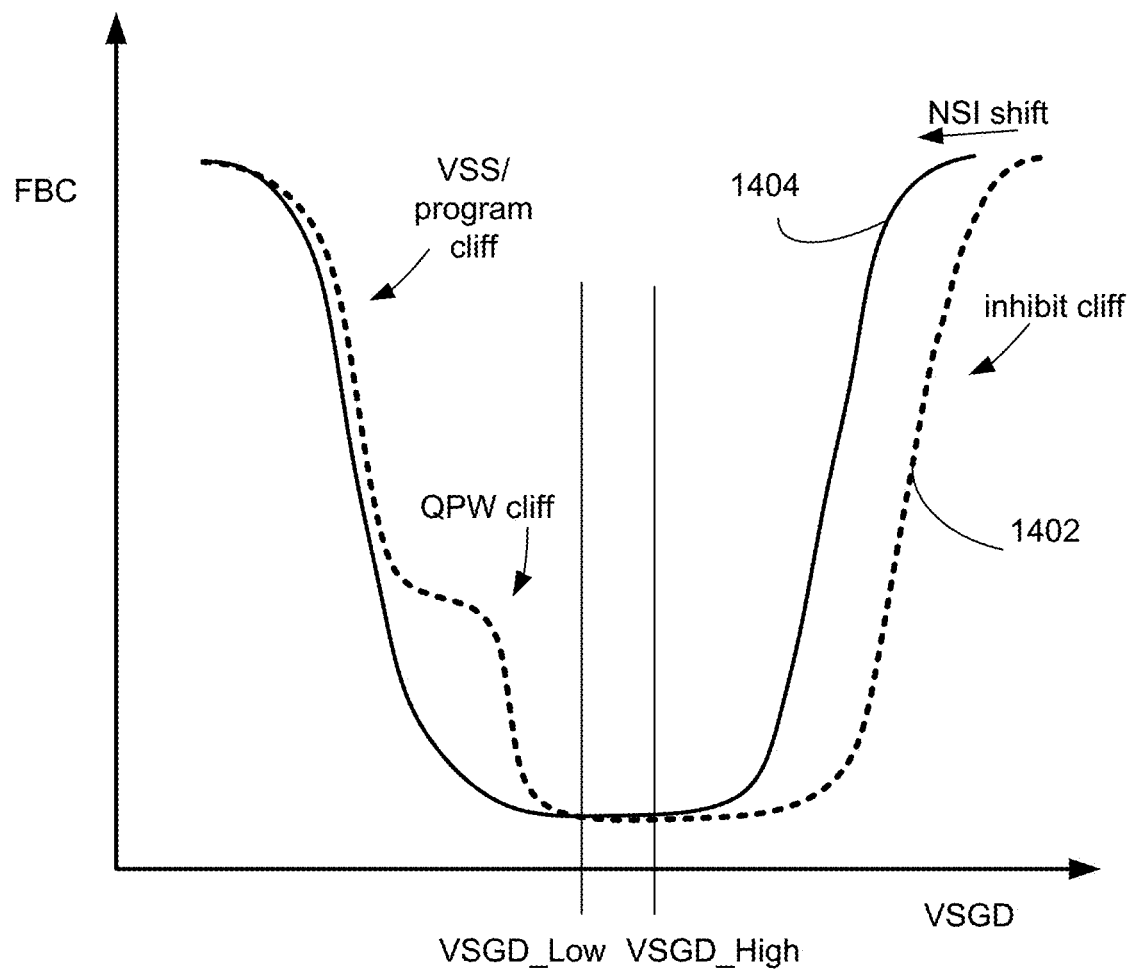
FIG. 14 is a graph that depicts fail bit count (FBC) versus drain side select gate voltage (VSGD).

In some embodiments, NSI is mitigated by control of the magnitude of the select voltage to the selected drain side select line. In one embodiment, the select voltage is greater if there is any memory cell undergoing QPW than if no memory cell is undergoing QPW. FIG. 14 will be used to discuss factors for the selection of magnitude of the select voltage to the selected drain side select line. FIG. 14 is a graph that depicts fail bit count (FBC) versus drain side select gate voltage (VSGD). Curve 1402 is for a case in which quick pass write (QPW) is used. Curve 1404 is for a case in which QPW is not used, and also considering impact of NSI to the select transistors. This impact can be seen by the NSI shift at the inhibit cliff. Each curve indicates that the FBC is highest when the magnitude of VSGD is too low (VSS/program cliff) or too high (inhibit cliff). However, curve 1402 has a QPW cliff, which is due to the use of QPW. The voltage VSGD_high is located between the QPW cliff and the inhibit cliff for curve 1402 to result in a low FBC when QPW is used. The voltage VSGD_low is located between the Vss/program cliff and the inhibit cliff for curve 1404 to result in a low FBC when QPW is not used. In an embodiment, voltage VSGD_high is used when QPW is used, but VSGD_low is used when QPW is not used. Using the lower VSGD when QPW is not used moves VSGD away from the inhibit cliff of 1404. As noted the inhibit cliff of 1404 is shifted down from the inhibit cliff of 1402 due to NSI. Therefore, using the lower VSGD helps mitigate impacts of NSI.

The following summarizes some of the factors for establishing a suitable magnitude for the select gate voltage. The select gate voltage should be high enough to keep the select transistor of a selected NAND string on, given the program enable voltage applied to the bit line, which can be expressed as:

$$Vsgd > Vt \quad (1)$$

In equation 1, Vt is the threshold voltage of the select transistor, which could be around 3 V. It is assumed that the program enable voltage is 0V. Also, the select gate voltage should be low enough to keep the select transistor of an unselected NAND string off, given the program inhibit voltage applied to the bit line, which can be expressed as:

$$Vsgd - VDDSA < Vt \quad (2)$$

In equation 2, Vt is again the threshold voltage of the select transistor. The program inhibit voltage is VDDSA, which might be about 2.5V. Combining equations 1 and 2 results in:

$$0 < Vsgd - Vt < VDDSA \quad (3)$$

When QPW is used, there is a third condition, given by:

$$Vsgd - Vt > VBL\_QPW \quad (4)$$

In equation 4, VBL_QPW is the slow programming (or QPW) voltage applied to the bit line, which might be around 1 V. Referring back to FIG. 14, the location of the VSS/program cliff is largely governed by Equation 1. The location of the inhibit cliff is largely governed by Equation 2. Note that the NSI impact may be viewed as lowering the apparent Vt of the select transistor. With reference to Equation 2, it can be seen how lowering the Vt of the select transistor will shift the inhibit cliff. The location of the QPW cliff is largely governed by Equation 4.

Figure 15:
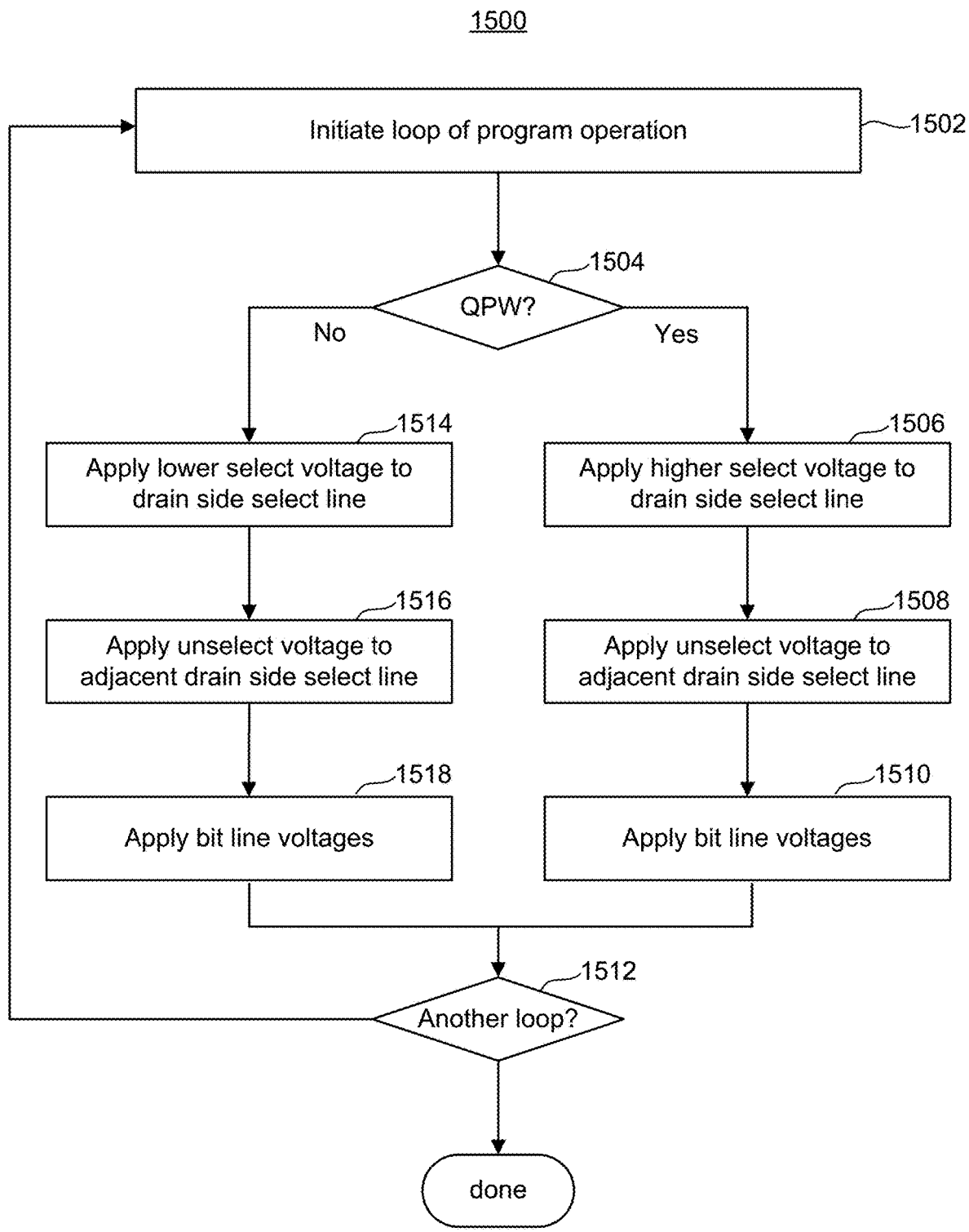
FIG. 15 is a flowchart of one embodiment of a process of applying drain side select line voltages during a program operation.

FIG. 15 is a flowchart of one embodiment of a process 1500 of applying drain side select line voltages during a program operation having a number of loops. In one embodiment, the programming process in FIG. 6 is used. The process 1500 is typically used for MLC programming. Hence, the process 1500 may be used when programming cells to two bits, three bits, four bits, but is not limited thereto. Process 1500 may be used to mitigate NSI to drain side select transistors (such as semi-circle select transistors). Process 1500 may be used in combination with process 900 or 1100, but is not required to be used with either process 900 or 1100.

Step 1502 includes initiating a loop of a program operation. Step 1504 includes a determination of whether QPW is to be used for this program loop. In one embodiment, QPW is used for some but not all states. In one embodiment, QPW is used for all by the highest Vt state. In one embodiment, QPW is used for the A-state through the F-state, but not the G-state (see FIG. 5C). In one embodiment, QPW is used for S1-S14, but not S15 (see FIG. 5D).

If QPW is to be used, then steps 1506-1510 are performed. Step 1506 includes applying a higher select voltage to a drain side select line. For example, VSGD_High is used. As one example, VSGD_High is about 2.6V. In an embodiment, this is the select line in the sub-block that is selected for programming. Step 1508 includes applying an unselect voltage to an adjacent drain side select line. The unselect voltage could be about 0V. Step 1510 includes applying voltages to the bit lines.

After step 1510 a determination is made in step 1512 whether there is another program loop. If there is then the process initiates the next loop of the program operation in step 1502. Note that many of the steps of the program operation such as applying the program voltage and performing the verify are omitted from FIG. 15.

If QPW is not to be used steps 1514-1518 are performed. Step 1514 includes applying a lower select voltage to a drain side select line. For example, VSGD_Low is used. As one example, VSGD_Low is about 2.1V. In one embodiment, the VSGD_Low is about 0.5V less than VSGD_High. In one embodiment, the difference is about one half of the slow program voltage applied to the bit lines for QPW. For example, the slow program voltage could be about 1.0V. Step 1516 includes applying an unselect voltage to the adjacent drain side select line. Step 1518 includes applying voltages to the bit lines.

Figure 16:
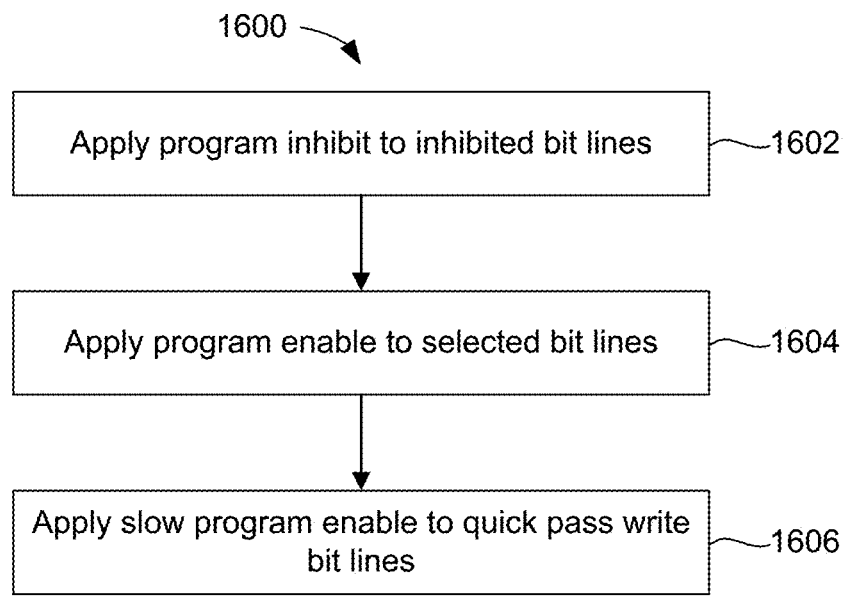
FIG. 16 is a flowchart of voltages applied to bit lines during an embodiment of a process of programming.

FIG. 16 is a flowchart of an embodiment of a process 1600 of voltages applied to bit lines during programming. The process 1600 may be used in step 1510 of process 1500. Step 1602 includes applying a program inhibit voltage to inhibited bit lines. In one embodiment, the program inhibit voltage is about 2.5 V. Step 1604 includes applying a program enable voltage to selected bit lines to receive full programming. In one embodiment, the program enable voltage is about 0 V. Step 1606 includes applying a slow programming voltage to selected bit lines to receive slow programming. In one embodiment, the slow programming voltage is about 1.0 V. The determination of which bit lines are to receive what voltage may be based on the verify status of the memory cell being programmed on the NAND string in the selected sub-block connected to the bit line.

Figure 17:
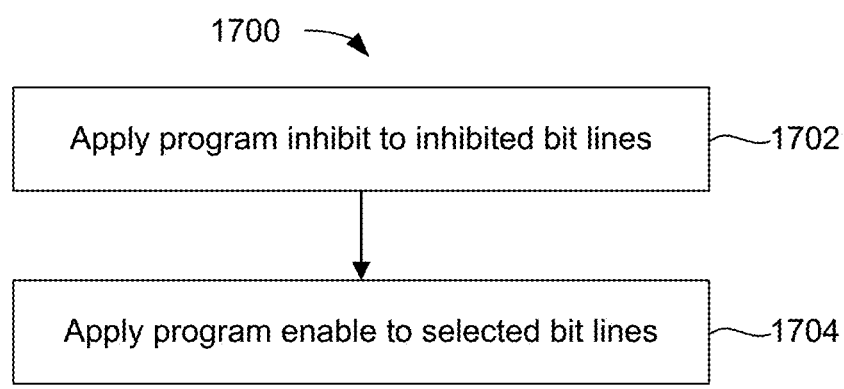
FIG. 17 is a flowchart of voltages applied to bit lines during an embodiment of a process of programming.

FIG. 17 is a flowchart an embodiment of a process 1700 of voltages applied to bit lines during programming. The process 1700 may be used in step 1518 of process 1500. Step 1702 includes applying a program inhibit voltage to inhibited bit lines. In one embodiment, the program inhibit voltage is about 2.5 V. In some embodiments, the program inhibit voltage is applied to inhibited bit lines by performing process 1100. Thus, step 1702 may include coupling up the voltage on some of inhibited bit lines as described herein. Therefore, the magnitude of the program inhibit voltage could be greater on one set of bit lines than another set. For example, one set could be charged to about 2.5V, with another set having the voltage coupled up to greater than 2.5 V, as described herein.

Step 1704 includes applying a program enable voltage to selected bit lines to receive full programming. In one embodiment, the program enable voltage is about 0V. In process 1700, the slow programming voltage is not used. This is a factor that allows the lower drain side select line voltage to be used (see FIG. 14). Therefore, NSI to drain side select transistors is mitigated.

Figure 18:
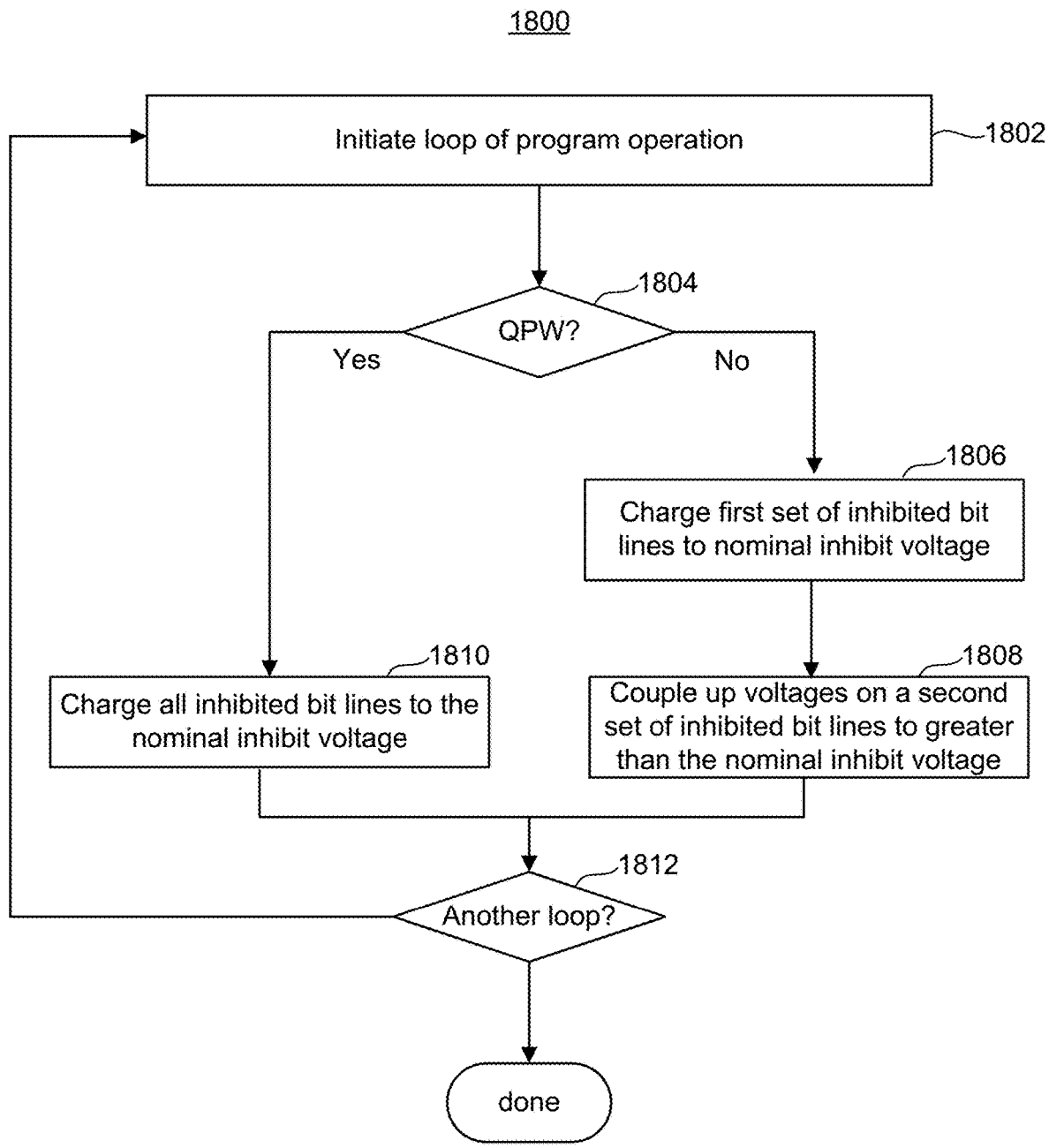
FIG. 18 is a flowchart of one embodiment of a process of selective use of coupling up of inhibited bit line voltages.

In some embodiments, the coupling up of the voltage on certain inhibited bit lines is only performed in a program loop in which QPW is not used. FIG. 18 is a flowchart of one embodiment of a process 1800 of selective use of coupling up of inhibited bit line voltages. The process 1800 may be used to mitigate NSI to select gates such as semi-circle select gates. Step 1802 includes initiating a loop of a program operation. Step 1804 includes a determination of whether QPW is to be used for this program loop. In one embodiment, QPW is used for some but not all states. In one embodiment, QPW is used for all by the highest Vt state. In one embodiment, QPW is used for the A-state through the F-state, but not the G-state (see FIG. 5C). In one embodiment, QPW is used for S1-S14, but not S15 (see FIG. 5D).

If QPW is to not be used, then steps 1806 and 1808 are performed. Note that steps 1806 and 1808 could be performed together. Hence, step 1808 does not necessarily follow step 1806. Step 1806 includes charging a first set of inhibited bit lines to a nominal program inhibit voltage. Step 1806 may include use of the charging path depicted in FIG. 12A, such that the first set of bit lines may be charged to VDDSA (e.g., a nominal program inhibit voltage). Step 1808 includes coupling up (or boost) voltages on a second set of inhibited bit lines. In one embodiment, process 900 is performed in order to achieve steps 1806 and 1808. In one embodiment, process 1100 is performed in order to achieve steps 1806 and 1808. The selection of the inhibited bit lines to have their voltages coupled up may be as described in connection with FIG. 10A or 10B. The circuit 1200 of FIGS. 12A and 12B may be used as described above.

If QPW is to be used, then step 1810 is performed. Step 1810 includes directly charging all the inhibited bit lines to the nominal program inhibit voltage. In an embodiment, all of the inhibited bit lines are charged to VDSSA by use of circuit 1200. The direct charge may be achieved by use of the charging path depicted in FIG. 12A.

Step 1812 is a determination of whether there is another program loop. The process returns to step 1802, if needed.

A memory system has been described that mitigates NSI in a 3D memory array. In some embodiments, NSI to semi-circle select transistors is mitigated. In some embodiments, a control circuit increases a voltage on a first set of bit lines to boost floating voltages on a second set of bit lines. Therefore, the second set of bit lines may be boosted to a high voltage, which can present leakage current in semi-circle select transistors. In some embodiments, the control circuit selects a magnitude of a select voltage to a drain side select line to mitigate NSI to drain side select gates.

A first embodiment includes a non-volatile storage apparatus comprising a control circuit configured to connect to a three-dimensional memory structure comprising NAND strings. Each NAND string comprises memory cells and a drain side select gate. The three-dimensional memory structure comprise bit lines. Each drain side drain side select gate of a NAND string is associated with a bit line. The three-dimensional memory structure comprises word lines connected to memory cells on the NAND strings. The control circuit is configured to pre-charge a first set of the bit lines to a first voltage. The control circuit is configured to pre-charge a second set of the bit lines to a second voltage that is greater than the first voltage. The control circuit is configured to float the second set of the bit lines after charging to the second voltage. The control circuit is configured to increase the voltage on the first set of the bit lines from the first voltage to a third voltage while the second set of the bit lines are floating to couple up the voltages on the second set of the bit lines to a voltage greater than the second voltage. The control circuit is configured to apply a voltage to a selected word line while the first set of the bit lines are at the third voltage and while the voltages on the second set of the bit lines are at the voltage greater than the second voltage, wherein the selected word line is connected to a memory cell on each of the NAND strings.

In a second embodiment, in furtherance to the first embodiment, the second voltage and the third voltage have the same magnitude.

In a third embodiment, in furtherance to the first or second embodiments, the control circuit is further configured to receive a supply voltage. The control circuit is configured to generate the second voltage from the supply voltage, wherein the second voltage has a magnitude that is less than or equal to the supply voltage, wherein the voltage greater than the second voltage to which the second set of the bit lines are boosted has a magnitude that is greater than the supply voltage.

In a fourth embodiment, in furtherance to any of the first to third embodiments, the first set of the bit lines and the second set of the bit lines are unselected bit lines; and the second voltage is a program inhibit voltage.

In a fifth embodiment, in furtherance to the fourth embodiment, the first voltage is a program enable voltage; the voltage applied to the selected word line by the control circuit is a program voltage; and the control circuit is further configured to apply boosting voltages to unselected word lines connected to the NAND strings.

In a sixth embodiment, in furtherance to the fourth or fifth embodiments, the control circuit is further configured to pre-charge all inhibited bit lines to the program inhibit voltage during a quick pass write phase of a program operation without floating any inhibited bit lines. After the quick pass write phase of the program operation, the control circuit: pre-charges the first set of the bit lines to the first voltage; pre-charges the second set of the bit lines to the second voltage that is greater than the first voltage; floats the second set of the bit lines after charging to the second voltage; and increases the voltage on the first set of the bit lines from the first voltage to the third voltage while the second set of the bit lines are floating to couple up the voltages on the second set of the bit lines to a voltage greater than the second voltage.

In a seventh embodiment, in furtherance to any of the first or to sixth embodiments, the control circuit comprises a plurality of charging circuits each having a plurality of transistors connected in series, a first of the transistors at a first end of the series connection of transistors is connected to a bit line. The control circuit is further configured to pre-charge the second set of the bit lines to the second voltage by, for each charging circuit connected to a bit line in the second set of the bit lines: applying the second voltage to a drain of a second transistor of the series connected transistors and turn on each of the plurality of transistors to pre-charge the bit line in the second set of the bit lines to the second voltage, wherein the second transistor is at a second end of the series connection of transistors; and applying approximately the second voltage plus a threshold voltage of a third transistor of the transistors to a control gate of the third transistor to float the bit line in the second set of the bit lines, wherein the third transistor is between the first transistor and the second transistor in the series connection.

In an eighth embodiment, in furtherance to any of the first or to seventh embodiments, the control circuit is further configured to: apply a fourth voltage to a first select line that is connected to first drain side select gates of a first set of the NAND strings; and apply a fifth voltage to a second select line that is adjacent to the first select line with an insulator separating the first select line and the second select line, wherein the second select line is connected to second drain side select gates of a second set of the NAND strings. Each of the bit lines is connected to one of the first drain side select gates and one of the second drain side select gates.

In a ninth embodiment, in furtherance to the eighth embodiment, the second set of the bit lines comprise bit lines connected to drain side select gates connected to the second select line that are formed in memory holes that are intersected by the insulator. The fifth voltage that is applied to the second select line is an unselect voltage. The fourth voltage that is applied to the first select line is a select voltage having a magnitude greater than the unselect voltage.

In a tenth embodiment, in furtherance to the ninth embodiment, the first set of the bit lines comprise bit lines connected to drain side select gates connected to the second select line that are formed in memory holes for which the insulator does not intersect the memory hole.

In an eleventh embodiment, in furtherance to the eighth embodiment, the second set of the bit lines comprise bit lines connected to drain side select gates connected to the first select line that are formed in memory holes that are intersected by the insulator. The fifth voltage that is applied to the second select line is an unselect voltage. The fourth voltage that is applied to the first select line is a select voltage having a magnitude greater than the unselect voltage.

In a twelfth embodiment, in furtherance to the eleventh embodiment, the first set of the bit lines comprise bit lines connected to drain side select gates connected to the first select line that are formed in memory holes for which the insulator does not intersect the memory hole.

In a thirteenth embodiment, in furtherance to any of the first to twelfth embodiments, the control circuit is further configured to apply a first select voltage to a drain side select line connected to a group of the NAND strings for any loops of a program operation in which at least some memory cells receive slow programming. The control circuit is further configured to apply a second select voltage to the drain side select line for any loops of the program operation in which none of the memory cells receive slow programming, wherein the second voltage has a lower magnitude than the first voltage.

One embodiment includes a method of operating non-volatile storage. The method comprises pre-charging a first set of unselected bit lines to a program inhibit voltage, wherein the first set of unselected bit lines reside in a three-dimensional memory structure having NAND strings. Each NAND string has memory cells and a drain side select transistor associated with a bit line. The method comprises pre-charging a second set of unselected bit lines in the three-dimensional memory structure to voltage having a lower magnitude than a magnitude of the program inhibit voltage. The NAND strings are associated with the second set of the bit lines. The method comprises floating the first set of unselected bit lines after charging the first set of the unselected bit lines to the program inhibit voltage. The method comprises increasing a voltage on the second set of the unselected bit lines to the program inhibit voltage while the first set of the unselected bit lines are floating to couple up the voltages on the first set of unselected bit lines to a voltage greater than the program inhibit voltage. The method comprises applying a programming voltage to a selected word line in the three-dimensional memory structure while the first set of the unselected bit lines are at the voltage greater than the program inhibit voltage and while the voltage on the second set of the unselected bit lines are at the program inhibit voltage. The selected word line is connected to a memory cells on each of the NAND strings.

One embodiment includes a non-volatile storage device comprising a three-dimensional memory structure comprising a plurality of NAND strings, a plurality of bit lines associated with the NAND strings, and a plurality of drain side select lines. Each NAND string comprises non-volatile memory cells and a drain side select transistor. Each drain side select transistor is associated with a bit line. Each drain side select line is connected to a drain side select transistor on a group of the NAND strings. The non-volatile storage device comprises a control circuit in communication with the plurality of NAND strings, the plurality of bit lines, and the plurality of drain side select lines. The control circuit applies a first voltage to a first drain side select line connected to a group of the NAND strings for any loops of a program operation in which at least some memory cells receive slow programming. The control circuit applies a second voltage to the first drain side select line for any loops of the program operation in which none of the memory cells receives slow programming, wherein the second voltage has a lower magnitude than the first voltage.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus comprising:
   a control circuit configured to connect to a three-dimensional memory structure comprising NAND strings, each NAND string comprising memory cells and a drain side select gate, the three-dimensional memory structure comprising bit lines, each drain side select gate of a NAND string associated with a bit line, the three-dimensional memory structure comprising word lines connected to memory cells on the NAND strings, the control circuit configured to:
   pre-charge a first set of the bit lines to a first voltage;
   pre-charge a second set of the bit lines to a second voltage that is greater than the first voltage;
   float the second set of the bit lines after charging to the second voltage;
   increase the voltage on the first set of the bit lines from the first voltage to a third voltage while the second set of the bit lines are floating to couple up the voltages on the second set of the bit lines to a voltage greater than the second voltage; and
   apply a program voltage greater than zero volts to a selected word line while the first set of the bit lines are at the third voltage and while the voltages on the second set of the bit lines are at the voltage greater than the second voltage, wherein the selected word line is connected to a memory cell on each of the NAND strings.

2. The apparatus of claim 1, wherein the second voltage and the third voltage have the same magnitude.

3. The apparatus of claim 1, wherein the control circuit is further configured to:
   receive a supply voltage; and
   generate the second voltage from the supply voltage, wherein the second voltage has a magnitude that is less than or equal to the supply voltage, wherein the voltage greater than the second voltage to which the second set of the bit lines are boosted has a magnitude that is greater than the supply voltage.

4. The apparatus of claim 1, wherein:
the first set of the bit lines and the second set of the bit lines are unselected bit lines; and
the second voltage is a program inhibit voltage.

5. The apparatus of claim 4, wherein:
the first voltage is a program enable voltage; and
the control circuit is further configured to apply boosting voltages to unselected word lines connected to the NAND strings.

6. The apparatus of claim 4, wherein the control circuit is further configured to:
pre-charge all inhibited bit lines to the program inhibit voltage during a quick pass write phase of a program operation without floating any inhibited bit lines;
wherein, after the quick pass write phase of the program operation, the control circuit:
pre-charges the first set of the bit lines to the first voltage;
pre-charges the second set of the bit lines to the second voltage that is greater than the first voltage;
floats the second set of the bit lines after charging to the second voltage; and
increases the voltage on the first set of the bit lines from the first voltage to the third voltage while the second set of the bit lines are floating to couple up the voltages on the second set of the bit lines to a voltage greater than the second voltage.

7. The apparatus of claim 1, wherein the control circuit comprises a plurality of charging circuits each having a plurality of transistors connected in series, a first of the transistors at a first end of the series connection of transistors is connected to a bit line, wherein the control circuit is further configured to pre-charge the second set of the bit lines to the second voltage by, for each charging circuit connected to a bit line in the second set of the bit lines:
applying the second voltage to a drain of a second transistor of the series connected transistors and turn on each of the plurality of transistors to pre-charge the bit line in the second set of the bit lines to the second voltage, wherein the second transistor is at a second end of the series connection of transistors; and
applying approximately the second voltage plus a threshold voltage of a third transistor of the transistors to a control gate of the third transistor to float the bit line in the second set of the bit lines, wherein the third transistor is between the first transistor and the second transistor in the series connection.

8. The apparatus of claim 1, wherein the control circuit is further configured to:
apply a fourth voltage to a first select line that is connected to first drain side select gates of a first set of the NAND strings; and
apply a fifth voltage to a second select line that is adjacent to the first select line with an insulator separating the first select line and the second select line, wherein the second select line is connected to second drain side select gates of a second set of the NAND strings, wherein each of the bit lines is connected to one of the first drain side select gates and one of the second drain side select gates.

9. The apparatus of claim 8, wherein:
the second set of the bit lines comprise bit lines connected to drain side select gates connected to the second select line that are formed in memory holes that are intersected by the insulator;
the fifth voltage that is applied to the second select line is an unselect voltage; and
the fourth voltage that is applied to the first select line is a select voltage having a magnitude greater than the unselect voltage.

10. The apparatus of claim 9, wherein:
the first set of the bit lines comprise bit lines connected to drain side select gates connected to the second select line that are formed in memory holes for which the insulator does not intersect the memory hole.

11. The apparatus of claim 8, wherein:
the second set of the bit lines comprise bit lines connected to drain side select gates connected to the first select line that are formed in memory holes that are intersected by the insulator;
the fifth voltage that is applied to the second select line is an unselect voltage; and
the fourth voltage that is applied to the first select line is a select voltage having a magnitude greater than the unselect voltage.

12. The apparatus of claim 11, wherein:
the first set of the bit lines comprise bit lines connected to drain side select gates connected to the first select line that are formed in memory holes for which the insulator does not intersect the memory hole.

13. The apparatus of claim 1, wherein the control circuit is further configured to:
apply a first select voltage to a drain side select line connected to a group of the NAND strings for any loops of a program operation in which at least some memory cells receive slow programming; and
apply a second select voltage to the drain side select line for any loops of the program operation in which none of the memory cells receive slow programming, wherein the second voltage has a lower magnitude than the first voltage.

14. A non-volatile storage device, comprising:
a three-dimensional memory structure comprising a plurality of NAND strings, a plurality of bit lines associated with the NAND strings, and a plurality of drain side select lines, each NAND string comprising non-volatile memory cells and a drain side select transistor, each drain side select transistor associated with a bit line, each drain side select line connected to a drain side select transistor on a group of the NAND strings; and
a control circuit in communication with the plurality of NAND strings, the plurality of bit lines, and the plurality of drain side select lines, wherein the control circuit:
applies a first voltage to a first drain side select line connected to a group of the NAND strings for any loops of a program operation in which at least some memory cells receive slow programming; and
applies a second voltage to the first drain side select line for any loops of the program operation in which none of the memory cells receives slow programming, wherein the second voltage has a lower magnitude than the first voltage.

15. The non-volatile storage device of claim 14, wherein the control circuit:
applies a third voltage to a second drain side select line that is adjacent to the first drain side select line with an insulator separating the first and the second drain side select lines, wherein the third voltage has a magnitude that is configured to keep drain side select transistors connected to the second drain side select line off regardless of whether a program enable voltage or a program inhibit voltage is applied to bit lines connected to the drain side select transistors connected to the second drain side select line.

16. The non-volatile storage device of claim 14, wherein the magnitude of the second voltage is based on a magnitude of a slow program enable voltage that is applied to bit lines connected to NAND strings having a memory cell to receive slow programming.

17. The non-volatile storage device of claim 14, wherein the magnitude of the second voltage is less than the magnitude of the first voltage by approximately one half a magnitude of a slow program enable voltage that the control circuit applies to bit lines connected to NAND strings having a memory cell to receive slow programming.

* * * * *